United States Patent [19]

Minami et al.

[11] Patent Number: 5,197,059
[45] Date of Patent: Mar. 23, 1993

[54] LASER DIODE CURRENT SUPPLY INCLUDING A THRESHOLD CURRENT COMPONENT SUBJECT TO AUTOMATIC POWER CONTROL

[75] Inventors: Akira Minami, Inagi; Masateru Sasaki, Yokohama, both of Japan

[73] Assignee: Fujitsu Limited, Kawasaki, Japan

[21] Appl. No.: 739,504

[22] Filed: Aug. 2, 1991

[30] Foreign Application Priority Data

Aug. 2, 1990 [JP] Japan .................. 2-205549

[51] Int. Cl.$^5$ ............................................ G11B 7/125
[52] U.S. Cl. .................................... 369/116; 369/124
[58] Field of Search .............. 369/116, 100, 109, 124; 250/205; 346/76 L

[56] References Cited

U.S. PATENT DOCUMENTS

| 4,785,443 | 11/1988 | Minami et al. ............. 369/116 |
| 5,059,780 | 10/1991 | Kakuta et al. ............. 250/205 |

FOREIGN PATENT DOCUMENTS

| 60-171646 | 9/1985 | Japan . | |
| 60-214432 | 10/1985 | Japan . | |
| 61-217940 | 9/1986 | Japan . | |
| 62-42339 | 2/1987 | Japan . | |
| 62-66424 | 3/1987 | Japan . | |
| 62-066424 | 3/1987 | Japan ............. | 369/116 |
| 62-089248 | 4/1987 | Japan ............. | 369/116 |
| 62-119743 | 6/1987 | Japan . | |
| 62-149033 | 7/1987 | Japan . | |
| 62-154335 | 7/1987 | Japan . | |
| 2-249147 | 10/1990 | Japan . | |

*Primary Examiner*—Jack I. Berman
*Assistant Examiner*—Jim Beyer
*Attorney, Agent, or Firm*—Staas & Halsey

[57] ABSTRACT

In an apparatus for supplying a current for driving a laser diode, an amount of current is supplied to the laser diode. During a read mode, a read peak current modified by a high frequency signal in addition to the amount of current is supplied to the laser diode, and during a write mode, a base read current in addition to the amount of current is supplied to the laser diode so that a light output of the laser diode is equal to a base read output. The read peak current is adjusted so that a mean value of the light output of the laser diode is equal to the base read output. An automatic control is performed upon the amount of current so that the light output of the laser diode is close to or approaches the base read output.

26 Claims, 19 Drawing Sheets

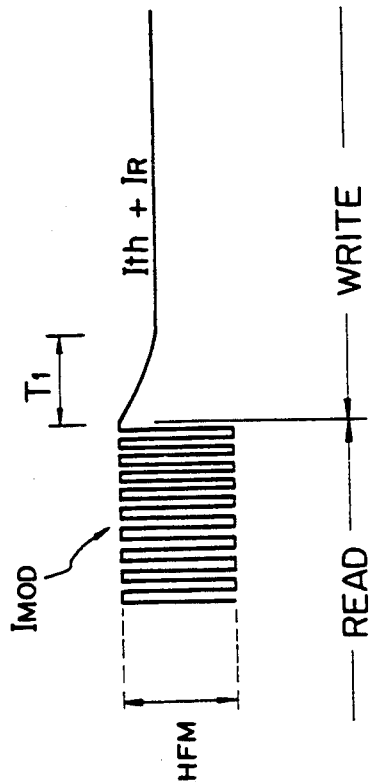
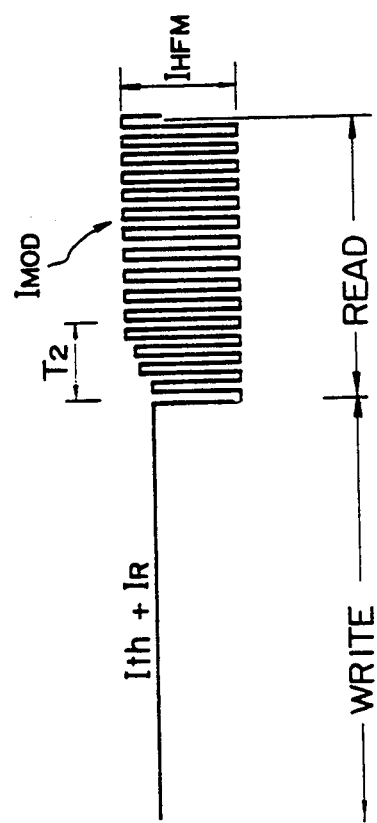
Fig. 3A PRIOR ART
Fig. 3B PRIOR ART

LASER DIODE CURRENT SUPPLY INCLUDING A THRESHOLD CURRENT COMPONENT SUBJECT TO AUTOMATIC POWER CONTROL

BACKGROUND OF THE INVENTION

1) Field of the Invention

The present invention relates to an apparatus for supplying a current to a laser diode, to cause the laser diode to emit a light to be used when reading digital data from an optical storage medium and when writing digital data thereto.

2) Description of the Related Art

Recently, many optical storage devices using an optical storage medium such as an optical disk, an optomagnetic disk, or an optical memory card have been developed. In such optical storage devices, a laser diode is used as a light source when carrying out a read operation and a write (or erase) operation. For example, during a write mode, a laser beam is made or projected incident to an area of a magnetic film of an optical storage medium which has been premagnetized, and as a result, that area of the magnetic film is heated. Accordingly, the direction of magnetization therein is inverted as compared to the of magnetization of adjacent areas thereof. Also, during an erase mode, a laser beam is projected incident to an area of the magnetic film to heat the area, and the heated area is then magnetized by using an external bias magnetic field. During a write or erase mode, a laser beam is used as the source of heat, and therefore, the driving of a laser diode for generating such heat requires a large amount of energy. On the other hand, during a read mode, when a laser beam is incident to an area of the magnetic film, the read data is determined by a change in a plane of polarization of a reflected light, due to the Kerr effect. Thus, in constrast, during a read mode, a laser diode for generating a laser beam is driven by a small amount of energy.

When the laser diode is driven by a small amount of energy, the output level of the laser diode is in a noise region, and the signal-to-noise (S/W) ratio of a reproduced signal is low. Therefore, to enhance this S/N ratio, a current supplied to the laser diode is modulated by a high frequency signal having a frequency much higher than a frequency used for recording data in the magnetic film, to enhance the peak of current supplied to the laser diode without increasing an effective output of light therefrom.

Also, to suppress fluctuations in the output of light emitted from the laser diode, an automatic power control (APC) technique is adopted, to bring a mean value of a light output during a read mode and a minimum light output (called a base read output) during a write mode close to a desired level.

In the above-mentioned laser diode drive system using an APC, although the desired level of the APC is not changed even when the control is transferred from a read mode to a write (or erase) mode, or vice versa, the drive current of the APC is changed, since the drive current of the laser diode, i.e., the illumination thereof during a read mode, is alternating current (AC), and the current provided during a write mode for a base read output is direct current (DC). Therefore, upon a switching between a read mode and a write (or erase) mode, the control of the light output is unstable due to a delay in the response caused by a time-constant of the APC, which reduces the speed of accessing to the optical storage medium, as later explained in detail.

SUMMARY OF THE INVENTION

An object of the present invention is to avoid fluctuations in the APC upon switching between a read mode and a write (or erase) mode, to thereby enhance the speed of access to an optical storage medium using such switching.

According to the present invention, a predetermined base amount of current is supplied to a laser diode during a read mode and during a write mode, and this predetermined current is not larger than a threshold current (minimum current) which causes the laser diode to emit light. During a read mode, a read peak current modified by a high frequency signal in addition to the predetermined amount of current is supplied to the laser diode, and during a write mode, a base read current in addition to the predetermined amount of current is supplied to the laser diode, so that the light output of the laser diode is equal to a base read output. The read peak current is adjusted so that a mean value of the light output from the laser diode is equal to the base read output, and an automatic control is performed upon the determined amount of current so that the light output from the laser diode is close to an apparatus the base read output. As a result, when the control is transferred from a read mode to a write (or erase) mode, or vice versa, since the mean value (effective value) of the light output during a read mode coincides with the light output (base read power) during a write mode, the drive current of the laser diode is not substantially changed. Therefore, the monitored output of light is not substantially changed, and thus the operation of the APC is stable. Thus, even after the control is switched, a read or write access may be immediately initiated.

Note, in an erase mode, although the light output is considerably larger than the base read output, the current is absorbed by other means from a monitored light output (current) supplied to the APC. Accordingly, the operation of the APC is also stable when switching the control from a read mode to an erase mode or vice versa.

BRIEF DESCRIPTION OF THE DRAWINGS

The present invention will be more clearly understood from the description as set forth below, with reference to the accompanying drawings, wherein:

FIGS. 3A and 3B are timing diagrams showing the operation of the apparatus of FIG. 1;

DESCRIPTION OF THE PREFERRED EMBODIMENTS

Before the description of embodiments of the present invention, a prior art apparatus for supplying a current to a laser diode will be explained with reference to FIGS. 1, 2, 3A, and 3B.

Figure 1:
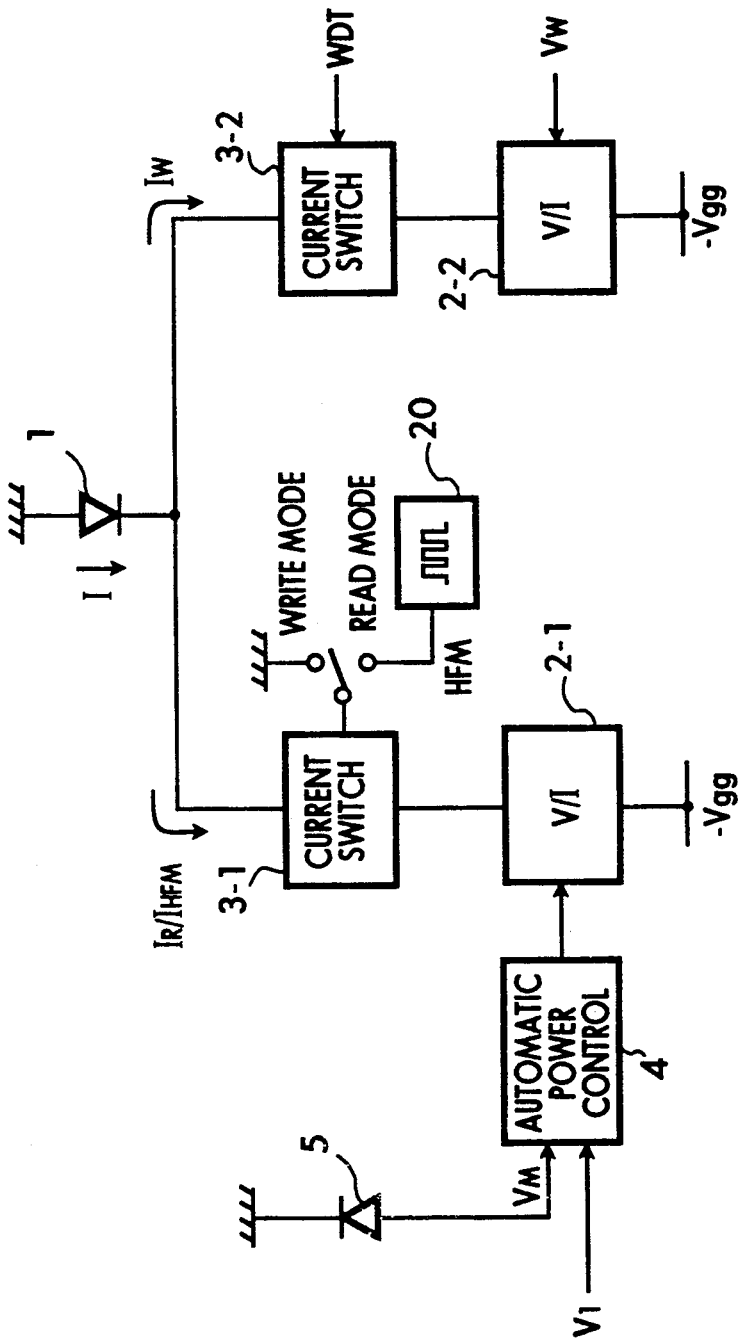
FIG. 1 is a block circuit diagram illustrating a prior art apparatus for supplying a current to a laser diode.

In FIG. 1, which illustrates a prior art apparatus for supplying a current, reference numeral 1 designates a laser diode connected to two parallel control current sources (voltage to current conversion circuits) 2-1 and 2-2, which receive voltages $V_I$ and $V_w$, respectively, from a microcomputer or the like (not shown).

The control current sources 2-1 and 2-2 are switched by current switches 3-1 and 3-2, respectively.

During a read mode, the current switch 3-1 is switched by using a high frequency signal HFM supplied from a high frequency signal generator 20. In this case, the frequency of the high frequency signal HFM is much higher than a frequency used for recording or writing data to the optical storage medium (not shown). As a result, a modified current having a read peak current $I_{HFM}$ in addition to a threshold current $I_{th}$ is supplied to the laser diode 1, to thereby obtain a read peak output $P_{HFM}$, as shown in FIG. 2.

Figure 2:
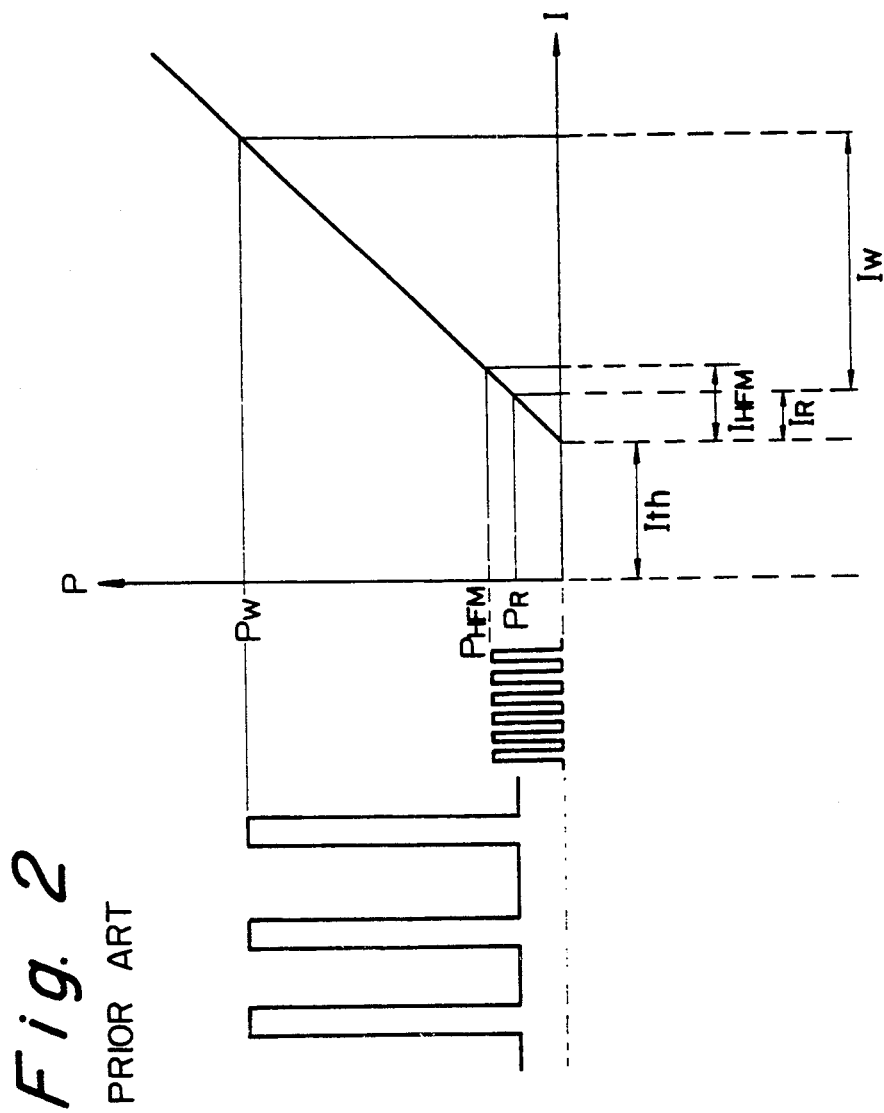
FIG. 2 is a graph showing a supplied current and a light output characteristic of the apparatus of FIG. 1.

During a write mode for data "0" (write data signal (WDT)), a base read current $I_R$ in addition to the threshold current $I_{th}$ is supplied to the laser diode 1, to thereby obtain a base read output $P_R$, as shown in FIG. 2.

During a write mode for data "1" (WDT ="1"), the current switch 3-2 is turned ON by a write data signal WDT, and as a result, a write current $I_W$ is added to a current ($I_{th}+I_R$) flowing in the laser diode 1, to obtain a write output $P_W$, as shown in FIG. 2.

Also, during an erase mode, the current switch 3-1 is operated under a write mode, and the current switch 3-2 is operated under a write mode for write data "1" (WDT="1"), and therefore, a current $I_{th}+I_R+I_W$ is continuously supplied to the laser diode 1.

An APC circuit 4 carries out an automatic power control of a current flowing through the control current source 2-1 so that a voltage VM showing or generated from a light output for the laser diode 1 monitored by a photo diode 5 is close to the voltage $V_R$ showing the base read output $P_R$. Thus, a fluctuation of the light output of the laser diode 1 due to a change of temperature, an elapse of time, and the like can be suppressed.

In the above-mentioned prior art apparatus for supplying a current, however, when the control is transferred from a read mode to a write mode, or vice versa, the control of the output of the laser diode 1 by the APC circuit 4 is actually fluctuated.

For example, as shown in FIG. 3A, when the control is transferred from a read mode to a write mode for data "0", a current supplied to the laser diode 1 is changed from a modulated current $I_{MOD}$ to a definite current $I_{th}+I_R$, even when the voltage $V_R$ is definite. As a result, a light output of the laser diode 1 is fluctuated, and thereby generate noise, as a monitored output, to the APC circuit 4, and thus, the operation of the APC circuit 4 becomes unstable. Such an unstable operation state of the APC circuit 4 continues for a time $T_1$, depending on a time constant of the APC s circuit 4, and for this time $T_1$, it is impossible to obtain a write access to the optical storage medium. Therefore, at worst, such a write access is initiated after one more rotation or write operation of the optical storage medium.

Similarly, as shown in FIG. 3B, when the control is transferred from a write mode for data "0" to a read mode, a current supplied to the laser diode 1 is changed from the definite current $I_{th}+I_R$ to the modulated current $I_{MOD}$ even when the voltage $V_1$ is definite. As a result, a light output of the laser diode 1 is fluctuated, and thereby creates noise, as a monitored power, to the APC circuit 4, and thus, the operation of the APC circuit 4 becomes unstable. Such an unstable operation state of the APC circuit 4 continues for a time $T_2$, depending on the time constant of the APC circuit 4, and for this time $T_2$, it is impossible to obtain a read access to the optical storage medium, and therefore, at worst, such a read access is initiated after one more rotation or read operation of the optical storage medium.

Figure 4:
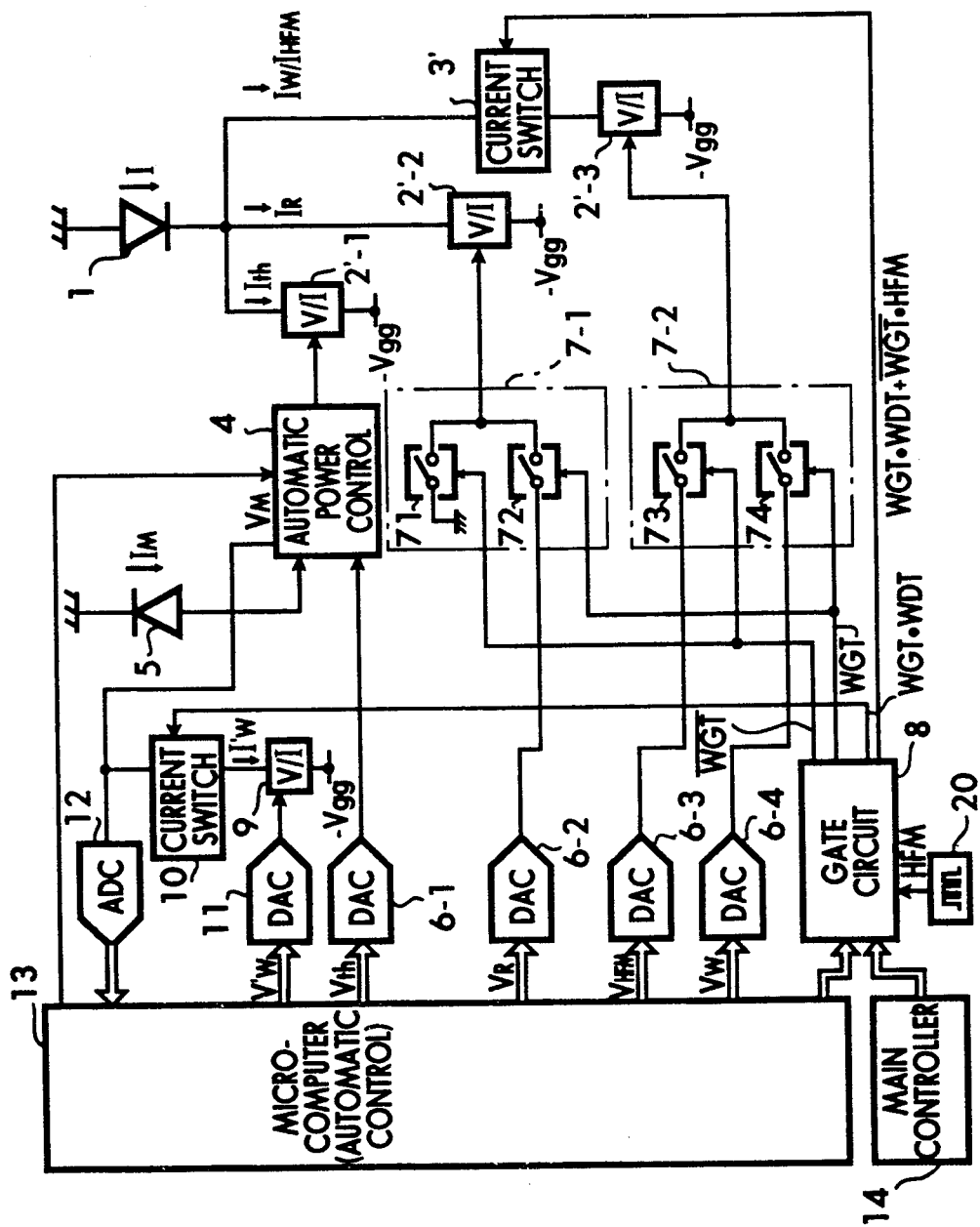
FIG. 4 is a circuit diagram illustrating a first embodiment of the apparatus for supplying a current to laser diode according to the present invention.

In FIG. 4, which is a first embodiment of the present invention, three control current sources 2'-1, 2'-2, and 2'-3 are provided, and a current switch 3' is connected in series to only the control current source 2'-3.

The control current source 2'-1 is used for supplying a threshold current (minimum current) $I_{th}$ (see FIG. 15) by which the laser diode 1 initiates the emitting of light therefrom. The APC circuit 4 is connected to only the control current source 2'-1, and therefore, an automatic power control is carried out for the threshold current $I_{th}$ in accordance with a difference between a voltage $V_{th}$ supplied by a digital/analog converter (DAC) 6-1 and a monitored voltage $V_M$ supplied by the photo diode 5. The control source 2'-2 is used for supplying a base read current $I_R$ (see FIG. 15) to the laser diode 1 during a write mode (WGT ="1"), while not supplying a current during a read mode (WGT ="1"). For this purpose, a switching circuit 7-1 formed by two switches 71 and 72 is provided. That is, during a write mode, when a gate signal WGT (="1") is supplied from a gate circuit 8 to the switch 72, a voltage $V_R$ corresponding to the base read current $I_R$ is applied by a converter (DAC) 6-2 to the control current source 2'-2. Note that, when a current $I_{th}+I_R$ is supplied to the laser diode 1, the light output is the base read output PR (see FIG. 15). On the other hand, during a read mode, when a gate signal $\overline{WGT}$ (="1") is supplied from the gate circuit 8 to the switch 71, 0 V is applied to the control current source 2'-2.

The control current source 2'-3 is used for supplying a read peak current $I_{HFM}$ (see FIG. 15) during a read mode ($\overline{WGT}$="1") and supplying a write current IW during a write mode for data "1" (WGT=WDT="1"). For this purpose, a switching circuit 7-2 formed by two switches 73 and 74 is provided. That is, during a read mode, when the gate signal $\overline{WGT}$ (="1") is supplied to the switch 73, a voltage $V_{HFM}$ corresponding to the read peak current $I_{HFM}$ is applied by a D/A converter 6-3 to the control current source 2'-3. Also, in this case, the current switch 3, is switched by the high frequency signal HFM, and therefore, the read peak current $I_{HFM}$ is modulated by the high frequency signal HFM. Note that, when a current $I_{th}+I_{HFM}$ is supplied to the laser diode 1, the light output is the read peak output $P_{HFM}$ (see FIG. 15). On the other hand, during a write mode for data "1", when the gate signal WGT (="138") is supplied to the switch 74, a voltage $V_W$ corresponding to the write current $I_W$ is applied by a D/A converter 6-4 to the control current source 2'-3. Also, in this case, the current switch 3, is turned ON by the signal WGT.WDT (="1"). Note that, when a current $I_{th}+I_R+I_W$ is supplied to the laser diode 1, the light output is the write output $P_W$ (see FIG. 15).

In the APC circuit 4, the threshold voltage $V_{th}$ by the D/A converter 6-1 is applied to one input and the monitored power voltage $V_M$ is applied to another input. Therefore, the threshold current $I_{th}$ flowing through the control current source 2'-1 is adjusted by the APC circuit 4 so that the monitored light output voltage $V_M$ is brought close to or approaches the threshold voltage Vth Note that a current to voltage conversion circuit is actually required to convert a current $I_M$ flowing through the photo diode 5 to the monitored output voltage VM at a pre-stage or input of the APC, circuit 4, but such a conversion circuit is omitted to simplify of the circuit. Also, such a conversion circuit can be included in the APC circuit 4 itself (see FIG. 6).

Also, a series of a control current source 9 and a current switch 10 are connected in series to the photo diode 5. During a write mode for data "1", when a gate signal WGT.WDT is supplied to the current switch 10, a voltage $V_W$, corresponding to the write current $I_W$ is applied by a D/A converter 11 to the control current source 9. Therefore, even when a write current $I_W$ is added to the current flowing through the laser diode 1, an increase in the monitored output voltage $V_M$ due to the write current $I_W$ is absorbed by the control current source 9. Therefore, during a write mode (WGT="1"), the monitored light output voltage $V_M$ is maintained at a value corresponding to the base read output $P_R$, regardless of the write data. In this case, a voltage $V_W$, corresponding to the above-mentioned increase represented by a current $I_W'$ is applied by the D/A converter 11 to the control voltage source 9, and thus, an abnormal operation of the APC circuit 4 due to the write current $I_W$ is avoided.

Reference numeral 12 designates an A/D converter ("ADC") for fetching the monitored output voltage $V_M$. Also, in this case, note that a current to voltage conversion circuit is actually required to convert the current $I_M$ flowing through the photo diode 5 to the monitored output voltage $I_M$ at a pre-stage or input of the A/D converter 12, but such a conversion circuit is omitted for a simplification of the circuit.

A microcomputer 13, which is formed by a central processing unit (CPU), a read-only memory (ROM), a random access memory (RAM), and the like, is provided for controlling the various elements in FIG. 4. This microcomputer 13 is used only for an automatic adjustment of the voltages $V_{th}$, $V_R$, $V_{HFM}$, $V_{Wl}$ and $V_W$.

A main controller 14 is provided for actually performing a read, write, or erase operation at the optical storage medium, after an automatic adjustment by the microcomputer 13.

Figure 5:
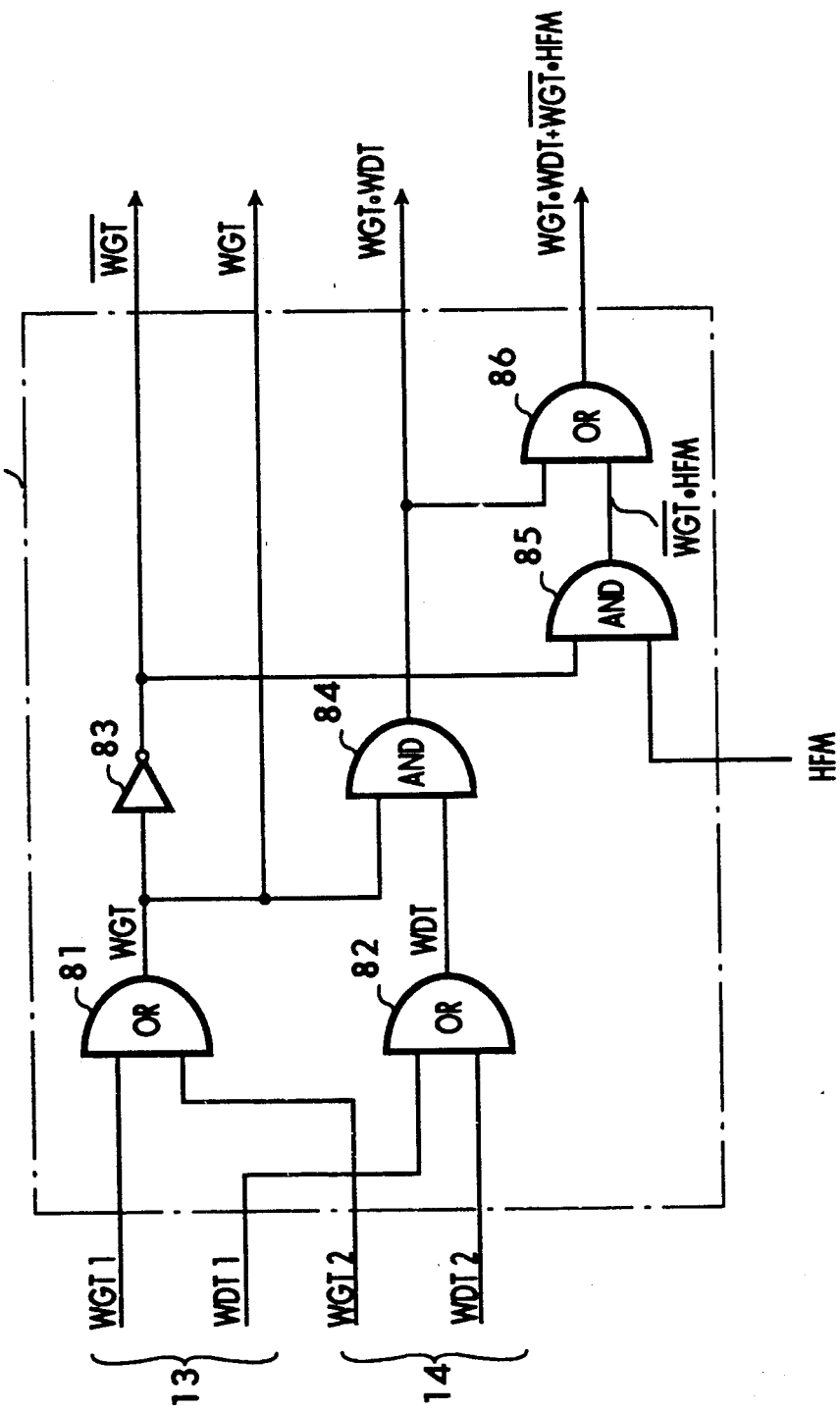
FIG. 5 is a logic circuit diagram of the gate circuit of FIG. 4.

Thus, the gate circuit 8 can be operated by both the microcomputer 13 and the main controller 14, as illustrated in FIG. 5.

In FIG. 5, the microcomputer 13 supplies a gate signal WGT1 during a write mode and a write data signal WDT1 to the gate circuit 8, and the main controller supplies a gate signal WGT2 during a wire mode and a write data signal WDT2. Also, a high frequency signal HFM is supplied to the gate circuit 8.

The data circuit 8 includes two OR circuits 81 and 82, an inverter 83, two AND circuits 84 and 85, and an OR circuit 86. The OR circuit 81 generates a gate signal WGT (="1"), when the microcomputer 13 generates a gate signal WGT1 (="1") or when the main controller 14 generates a gate signal WGT2 (="1"). In order words, when either of the microcomputer 13 or the main controller 14 is in a write mode, the OR circuit 81 generates the gate signal WGT (="1"). Similarly, the OR circuit 82 generates a write data signal WDT (="1") when the microcomputer 13 generates a write data signal WDT1 (="1"), or when the main controller 14 generates a write data signal WDT2 (="1").

The inverter 83 inverts the output WGT of the OR circuit 81, and accordingly, generates a gate signal $\overline{\text{WGT}}$. Also, the output WGT of the OR circuit 81 is directly output.

Since the AND circuit 84 is connected to the outputs of the OR circuits 81 and 82, the AND circuit 84 generates a gate signal WGT.WDT.

Also, since the AND circuit 85 is connected to the inverter 83 and receives the high frequency signal HFM, the AND circuit 85 generates a gate signal $\overline{\text{WGT}}$.HFM.

Further, since the OR circuit 86 is connected to the outputs of the AND circuits 84 and 85, the OR circuit 86 generates a gate signal WGT·WDT+$\overline{\text{WGT}}$.HFM.

Thus, the gate signals $\overline{\text{WGT}}$, WGT, WGT·WDT, and WGT·WDT+$\overline{\text{WGT}}$·HFM are generated by the gate circuit 8.

Figure 6:
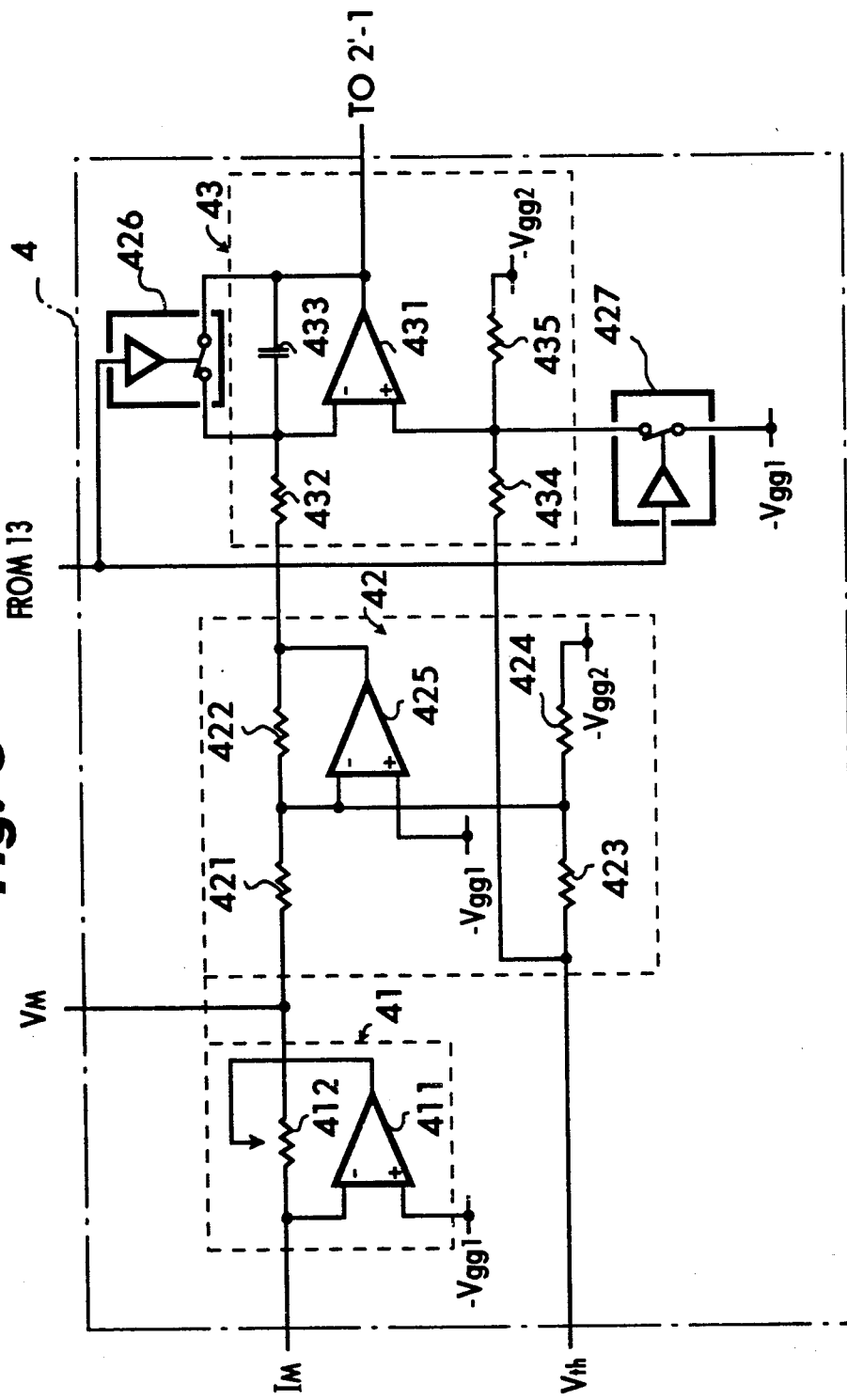
FIG. 6 is a circuit diagram of the APC circuit of FIG. 1.

In FIG. 6, which is a detailed circuit diagram of the APC circuit 4 of FIG. 4, the APC circuit 4 includes a differential amplifier 41 for converting a current $I_M$ flowing through the photodiode 5 into a voltage which is already indicated by $V_M$, a differential amplifier 42 for generating a difference signal between the light output voltage $V_M$ from the differential amplifier 41 and the threshold voltage $V_{th}$ from the D/A converter 6-1, and an integrator 43. In more detail, the differential amplifier 41 is formed by an operational amplifier 411 and a variable resistor 412. That is, if the currently is increased, to increase a current flowing through the resistor 412, a voltage between the terminals thereof is also increased. Thus, the differential amplifier 41 generates a voltage $V_M$ depending on the current $I_M$ with reference to $-V_{ggl}$. Also, the differential amplifier 42 is formed by an operational amplifier 425 and resistors 421 to 424. Also, the integrator 43 is formed by an operational amplifier 431, a resistor 432, a capacitor 433, resistors 434 and 435, and switches 426 and 427 controlled by the microcomputer 13.

The switch 426 is connected in parallel to the capacitor 433, and the switch 427 is connected to a non-inverting input of the operational amplifier 431. Therefore, to release an APC. i.e., to turn OFF the APC circuit 4, the microcomputer 13 turns ON the switch 426 and turns OFF the switch 427 as illustrated in FIG. 6, so that the integrator 43 serves as a voltage buffer, thereby applying the threshold voltage $V_{th}$ to the control current source 2'-1. On the other hand, to carry out an APC, the microcomputer 13 turns OFF the switch 426 and turns ON the switch 427, so that the integrator 43 forms an actual integrator and is activated.

Figure 7:
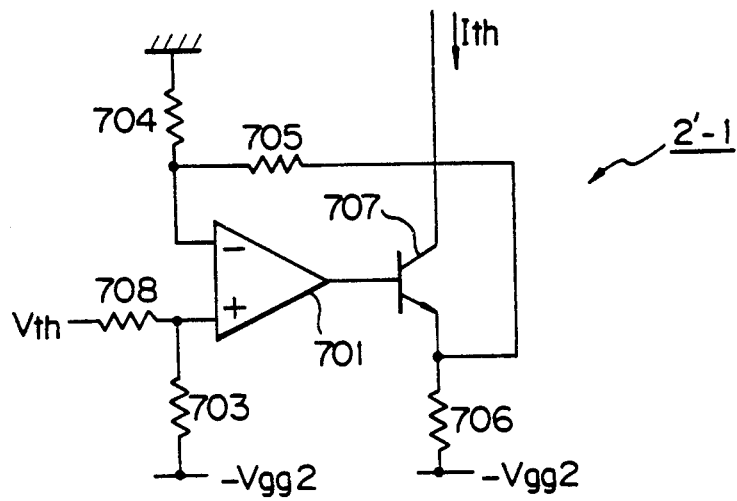
FIG. 7 is a circuit diagram of an example of the control current sources (voltage/current conversion circuits) of FIG. 4.

In FIG. 7, which illustrates an example of the control current source such as 2'-1 of FIG. 4, the control current source 2'-1 includes an operational amplifier 701, resistors 703 through 706 and 708 an output transistor 707. Therefore, when a voltage such as the threshold voltage $V_{th}$ is increased, a current flowing through the resistor 705 is increased, to thus increase the base-emitter voltage $V_{BE}$ of the output transistor 707. As a result, the current $I_{th}$ flowing through the output transistor 707 is dependent on the threshold voltage $V_{th}$. In other words, the voltage $V_{th}$ is converted to the threshold current $I_{th}$.

Figure 8:
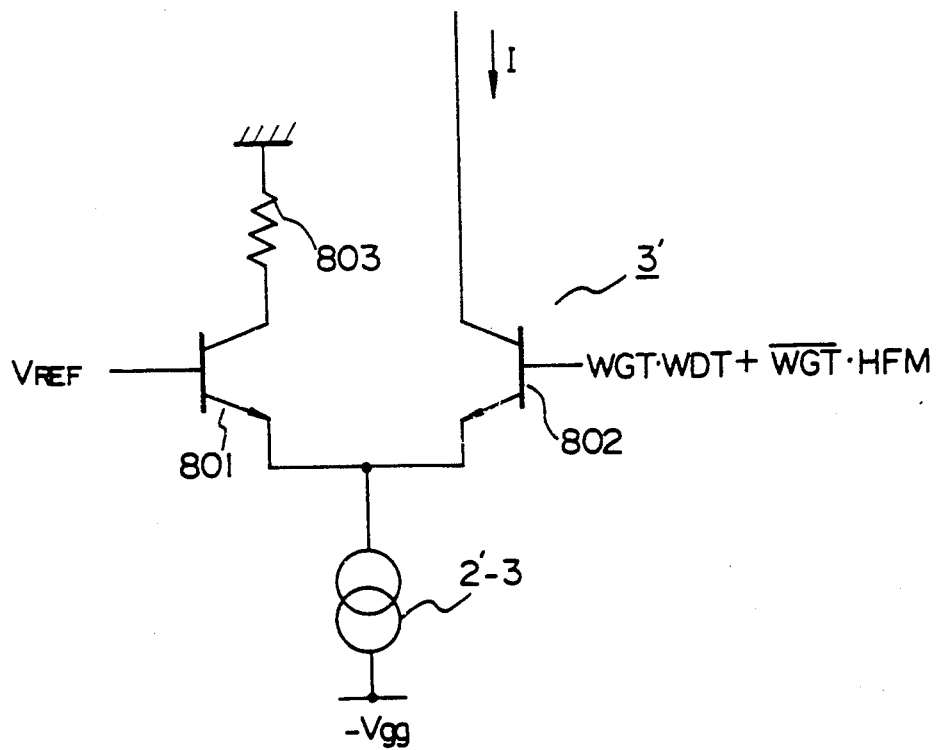
FIG. 8 is a circuit diagram of an example of the current switches of FIG. 4.

In FIG. 8, which illustrates an example of the current switches such as 3' of FIG. 4, the current switch 3' includes two NPN transistors 801 and 802 having a common emitter connected to a current source which is, in this case, the control current source 2'-3. Also, a resistor 803 is connected between a collector of the transistor 801 and a power supply such as the ground. Further, a reference voltage $V_{REF}$ is applied to a base of the transistor 801, and a gate signal such as WGT·WDT+$\overline{WGT}$·HFM is applied to a base of the transistor 802. Therefore, if the potential or voltage of the gate signal is lower than that of the reference voltage $V_{REF}$, the transistor 801 is turned ON and the transistor 802 is turned OFF, so that a current I does not flow. Conversely, if the potential of the gate signal is higher than the reference voltage $V_{REF}$, the transistor 801 is turned OFF and the transistor 802 is turned ON, so that a current I determined by the control current source 2'-3 flows through the transistor 802.

After a power is supplied to the microcomputer 13, the microcomputer 13 carries out an automatic control, as explained below.

Figure 9:
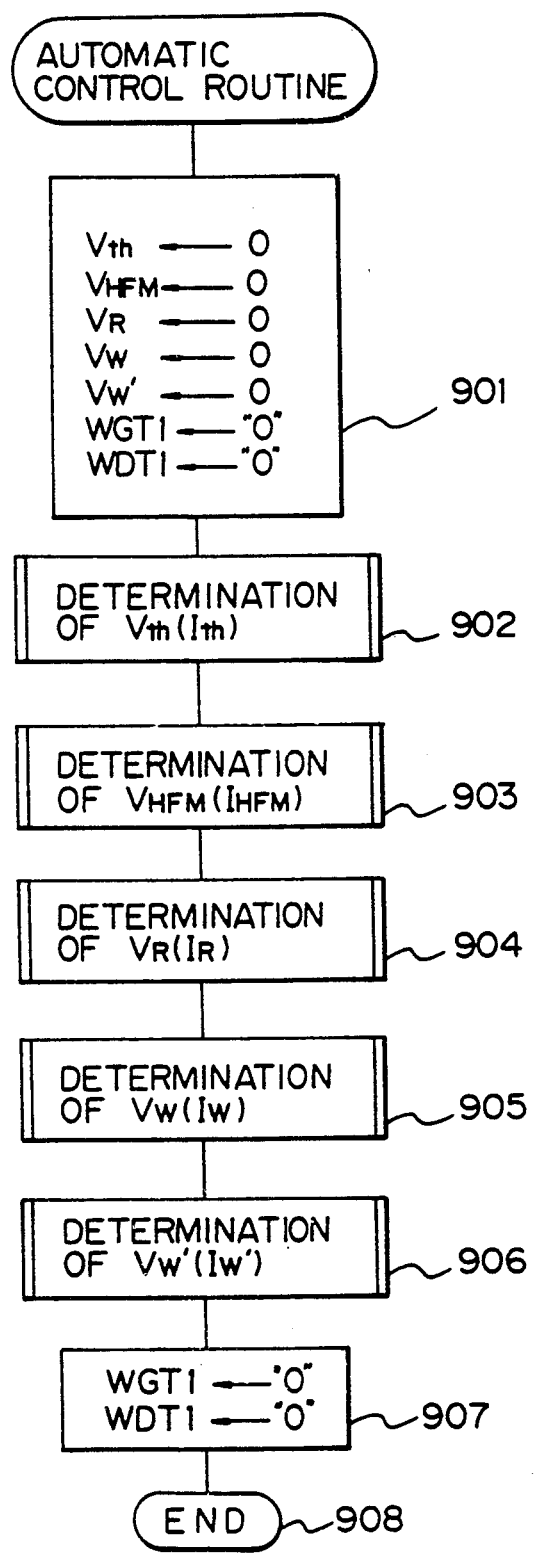
FIGS. 9 through 14 are flowcharts showing the operation of the microcomputer of FIG. 4.

In FIG. 9, which is an automatic control routine carried out after the power supply to the microcomputer 13 is turned ON, at step 901, an initialization is carried out. Particularly, the contents of $V_{th}$, $V_{HFM}$, $V_r$, $V_W$, and $V_W'$ in the RAM are cleared, and the data WGT1 and WDT1 in the RAM are reset.

At step 902, the value $V_{th}$ (i.e., $I_{th}$) for the D/A converter 6-1 is determined, and at step 903, the value $V_{HFM}$ (ie., $I_{HFM}$) the D/A converter 6-3 is determined. Also, step 904, the value VR (i.e., $I_R$) for the D/A converter 6-2 is determined, and at step 905, the value $V_W$ (i.e., $I_W$) for the D/A converter 6-4 is determined. Further, at step 906, the value $V_{W'}$, (i.e., $I_{W'}$) for the D/A converter 11 is determined. Steps 902 through 907 will be explained later in more detail.

Next, at step 907, the data WGT1 and WDT1, which at step 901, are reset (="0"), are set Then, the routine of FIG. 9 is completed at step 908.

Figure 10:
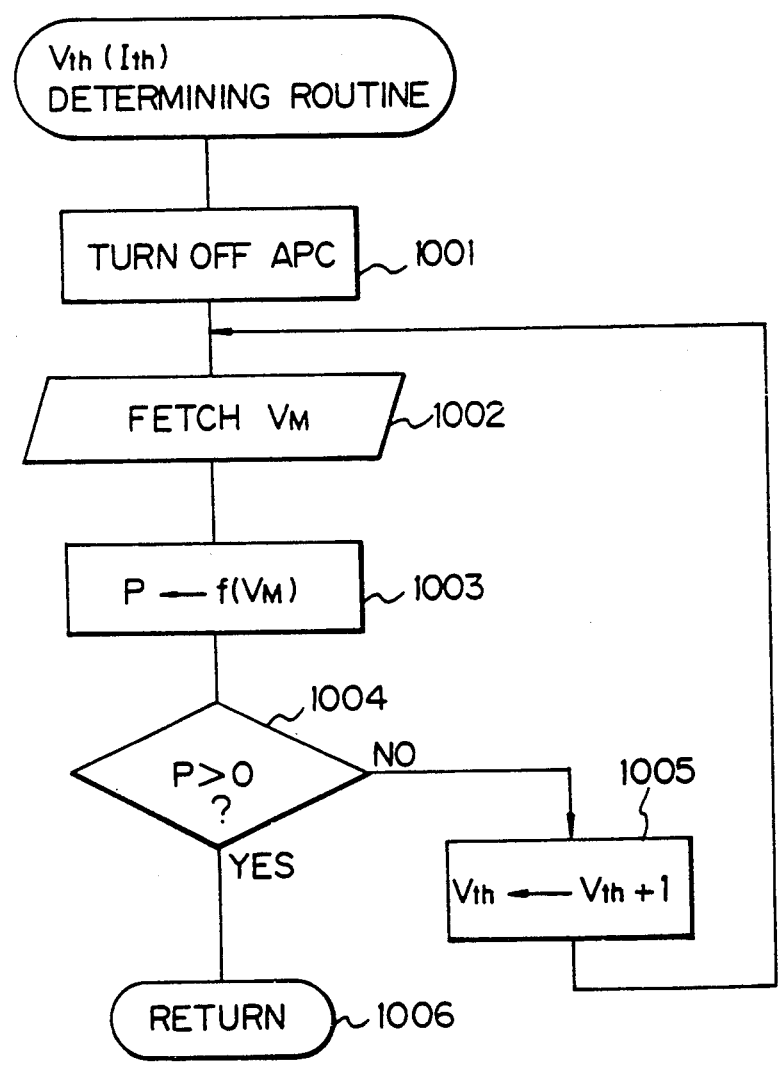

In FIG. 10, which is a detailed flowchart of the $V_{th}$ ($I_{th}$) determining step 902, the microcomputer 13 turns OFF the APC circuit 4 at step 1001, so that the threshold voltage Vth , which is, in this case, 0 V, is supplied from the D/A converter 6-1 directly to the control current source 2'-1. At step 1002, a monitored power voltage $V_M$ is fetched from the A/D converter 12, and at step 1003, the monitored output voltage $V_M$, is converted to a power P of the laser diode 1 in accordance with a predetermined function $f(V_M)$.

At step 1004, it is determined whether or not P is larger than 0, i.e., whether or not the laser diode 1 has initiated an emitting of light therefrom. As a result, if P<=0, the control proceeds to step 1005, which increases the value $V_{th}$ by a definite value such as 1, and the control at steps 1002 through 1004 are then repeated. Otherwise, the control proceeds to step 1006, thus completing the routine of FIG. 10. Thus, the value $V_{th}$, i.e., the threshold current $I_{th}$ is finally determined by the routine of FIG. 10, and is stored in the RAM.

Figure 11:
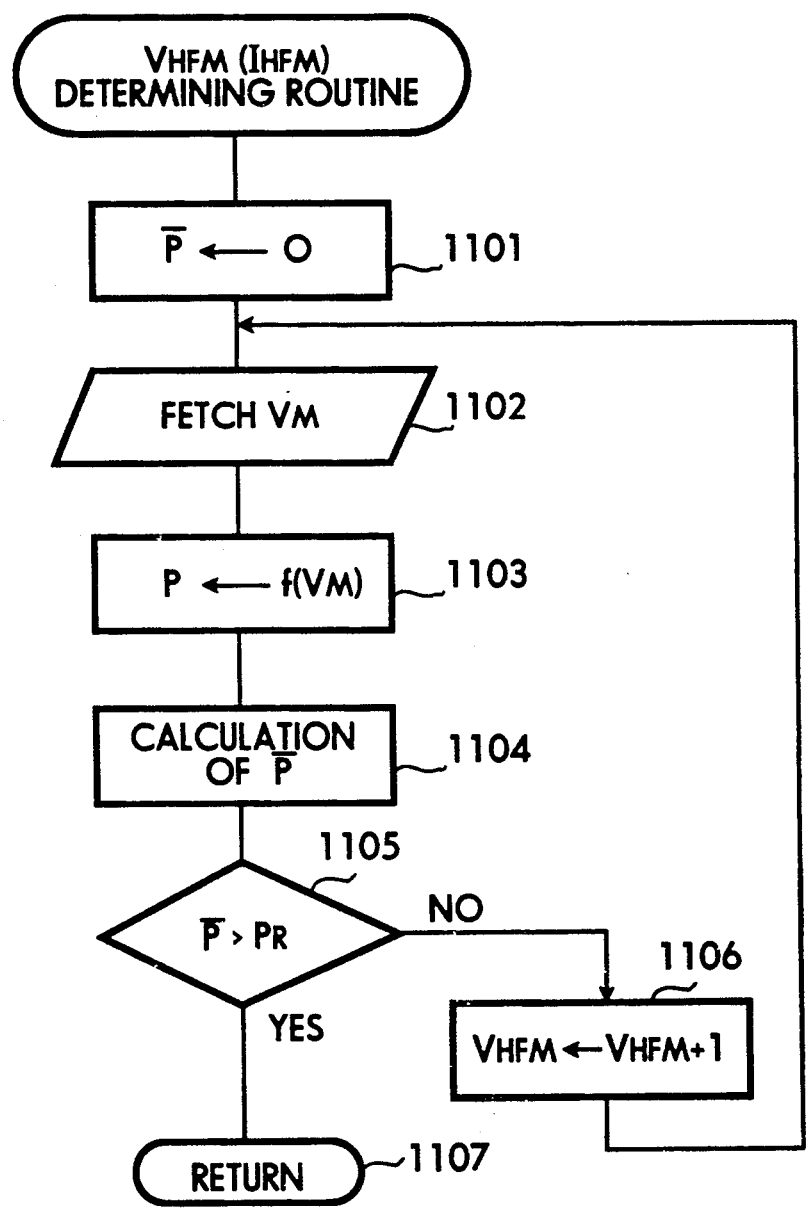

In FIG. 11, which is a detailed flowchart of the $V_{HFM}$ ($I_{HFM}$) determining step 903, since the data WGT1 is already reset (WGT1="0") and the data WGT2 of the main controller 14 is also reset (WGT2="0"), the value $V_{HFM}$, which is, in this case, 0 V, is supplied from the D/A converter 6-3 via the switch 73 to the control current source 2'-3 in FIG. 4. Also, in this case, the gate signal WGT·HFM of the gate circuit 8 represents HFM, and therefore, the current switch 3' is switched by the high frequency signal HFM.

First at step 1101, a mean value P of the monitored power P is cleared. Then, at step 1102, a monitored output voltage $V_M$ is fetched from the A/D converter 12, and at step 1103, the monitored output voltage $V_M$ is converted into a power P of the laser diode 1 in accordance with the predetermined function f ($V_M$).

At step 1104, the mean value $\overline{P}$ of the monitored power P is calculated by $$P \leftarrow \frac{n \cdot \overline{P} + P}{n + 1}$$

where n is a positive integer such as 3, 7, 15, . . . Of course, other calculation methods can be adopted. Note that, in this case, the monitored power P is an alternating current.

At step 1105, it is determined whether or not the mean value $\overline{P}$ of the monitored power P is larger than a base read output $P_R$, i.e., whether or not the mean value $\overline{P}$ equals or is less than equals the base read output $P_R$. As a result, if $P-\leq P_R$, the control proceeds to step 1106, which increases the value $V_{HFM}$ by a definite value such as 1, and the control at steps 1102 through 1105 as then repeated. Otherwise, the control proceeds to step 1107, thus completing the routine of FIG. 11. Thus, the value $V_{HFM}$, i.e., the read peak current $I_{HFM}$ is finally determined by the routine of FIG. 11 and is stored in the RAM.

Note that, when carrying out the routine of FIG. 11, a current $I=I_{th}+I_{HFM}$ is supplied to the laser diode 1.

Figure 12:
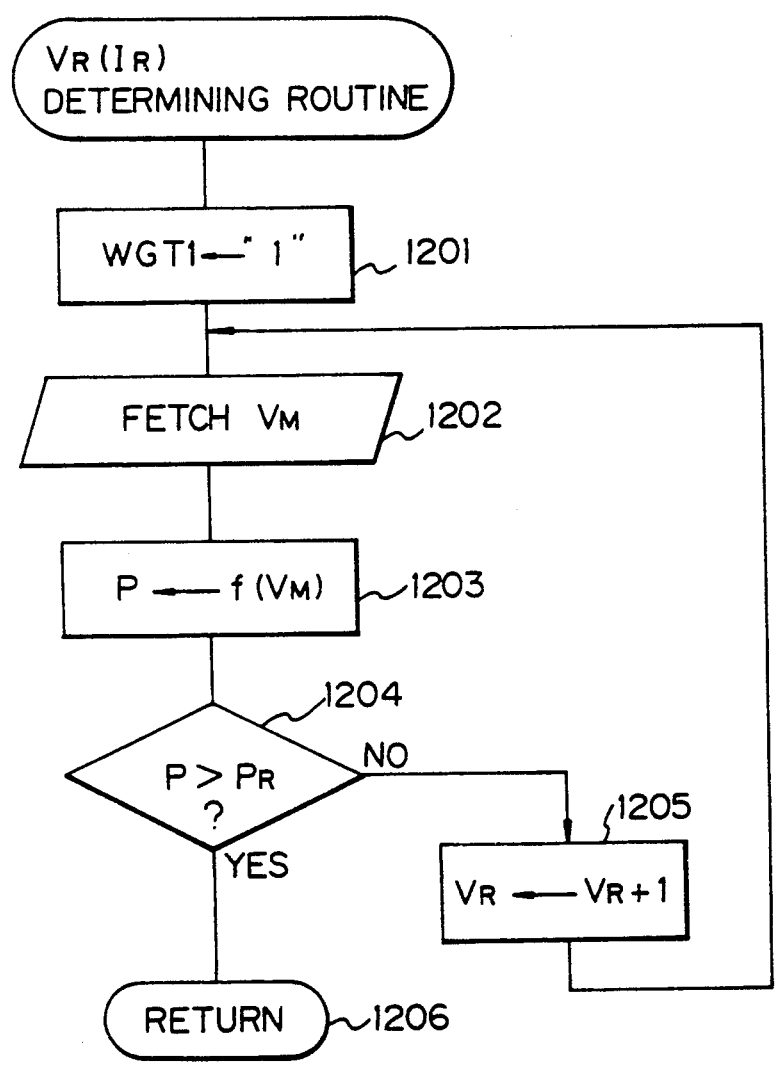

In FIG. 12, which is a detailed flowchart of $V_R$ ($I_R$) determining step 904, at step 1201, the gate signal WGT1 is set (WGT1="1"). As a result, the value $V_R$, which is, in this case, 0 V, is supplied from the D/A converter 6-2 via the switch 72 to the control current WGT·WDT+$\overline{WGT}$·HFM of the gate circuit 8 represents "0", since WGT ="1", WDT="0"(WDT1 was set to 0 in step 901 of FIG. 9 and WDT2 was set to zero previously by main controller 14), and WGT ="0". Therefore, the current switch 3' is turned OFF.

At step 1202, a monitored output voltage $V_M$ is fetched from the A/D converter 12, and at step 1203, the monitored output voltage VM is converted into a power P of the laser diode 1 in accordance with the determined function f($V_M$).

At step 1204, it is determined whether or not P is larger than $P_R$, i.e., whether or not the light power P equals or is less than the base read output $P_R$. As a result, if P $\leq P_R$, the control proceeds to step 1205 which increases the value $V_R$ by a definite value such as 1, and the control at steps 1202 through 1204 are then repeated. Otherwise, the control proceeds to step 1206, thus completing the routine of FIG. 12. Thus, the value $V_R$ for the base read output $P_R$ is finally determined by the routine of FIG. 12, and is stored in the RAM.

Note that, when carrying out the routine of FIG. 12, a current $I=I_{th}+I_R$ is supplied to the laser diode 1.

Figure 13:
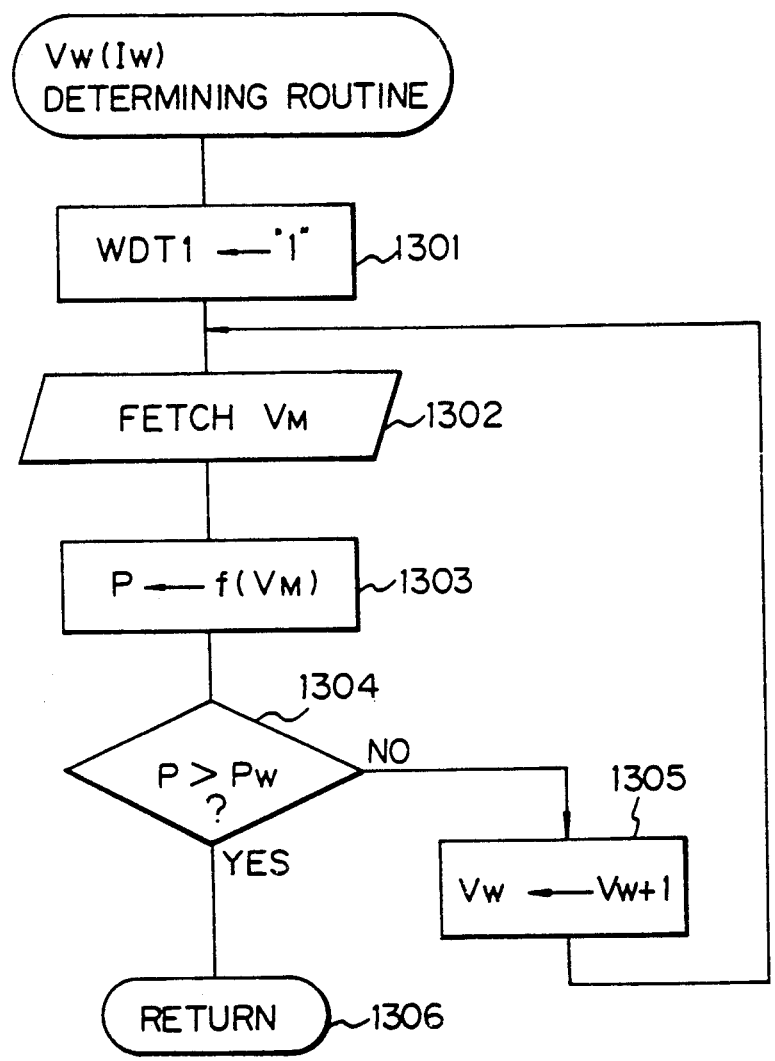

In FIG. 13, which is a detailed flowchart of the $V_W$ ($I_W$) determining step 905, at step 1301, the data signal WDT1 is set (WDT1="1"). As a result, the gate signal WGT·WDT+WGT·HFM of the gate circuit 8 represents "1", since WGT ="1", WDT ="1", and WGT ="0". Therefore, the current switch 3″ is turned ON. Also, in this case, since the gate signal WGT of the gate circuit is "1", the value $V_W$, which is, in this case, 0 V, is supplied from the D/A converter 6-4 via the switch 74 to the control current source 2′-3 is FIG. 4.

At step 1302, a monitored output voltage $V_M$ is fetched from the A/D converter 12, and at step 1403, the monitored output voltage $V_M$ is converted into a power P of the laser diode 1 in accordance with the predetermined function $f(V_M)$.

At step 1304, it is determined whether or not P is larger than $P_W$, i.e., whether or not the light power P reaches the write power $P_W$. As a result, if $P \leq P_W$, the control proceeds to step 1305 which increases the value $V_W$ by a definite value such as 1, and the control at steps 1402 through 1404 are then repeated. Otherwise, the control proceeds to step 1406, thus completing the routine of FIG. 13. Thus, the value $V_W$ for the write output $P_W$ is finally determined by the routine of FIG. 13, and is stored in the RAM.

Note that, when carrying out the routine of FIG. 13, a current $I=I_{th}+I_R+I_W$ is supplied to the laser diode 1.

Figure 14:
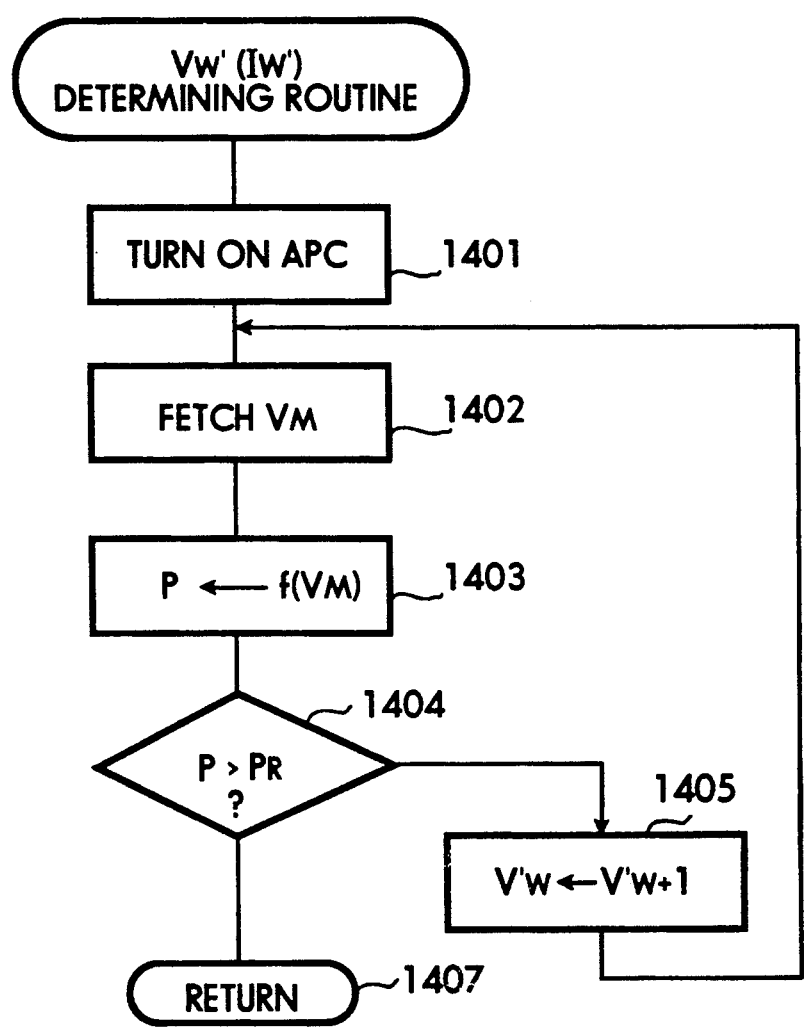

In FIG. 14, which is a detailed flowchart of $V_W$, ($I_W'$) determining step 906, at step 1401, the microcomputer 13 turns ON the APC circuit 4.

At step 1402, a monitored output voltage $V_M$ is fetched from the A/D converter 12, and at step 1403, the monitored output voltage $V_M$ is converted into a power P of the laser diode 1 in accordance with the predetermined function $f(V_M)$.

At step 1404, it is determined whether or not P is larger than PR , i.e., whether or not the light power P is equal to or less than the base read output $P_R$. As a result, if $P \leq P_R$, the control proceeds to step 1405 which increases the value $V_W$ by a definite value such as 1, and the control at steps 1402 through 1404 are then repeated. Otherwise, the control proceeds to step 1406, thus completing the routine of FIG. 14. Thus, the value $V_W'$ for an increased power due to the write current $I_W$ is finally determined by the routine of FIG. 14, and is stored in the RAM.

Note that, when carrying out the routine of FIG. 14, a current $I=I_{th}+I_R+I_W'$ is supplied to the laser diode 1.

The operation of the main controller 14 of FIG. 4 will be explained with reference to FIG. 15 which shows a current I supplied to a light power P characteristic of the current supplying apparatus of FIG. 4.

During a read mode, the main controller 14 generates a gate signal WGT2 (="0"), and accordingly, the gate circuit 8 generates a first gate signal $\overline{WGT}$ (="1"), a second gate signal WGT (="0"), a third gate signal WGT·WDT (="0"), and a fourth gate signal WGT·HFM +WGT·WDT=HFM. By the first gate signal $\overline{WGT}$ and the second gate signal WGT, the switches 71 and 73 are turned ON, and the switches 72 and 74 are turned OFF in FIG. 4. Therefore, 0 V is applied to the control current source 2′-2, and the read peak voltage $V_R$ is applied to the control current source 2,-3. By the third gate signal WGT·WDT (="0"), the current switch 10 is turned OFF, and therefore, a monitored output current $I_M$ is not absorbed in the control current source 9. By the fourth gate signal HFM, the current switch 3′ is switched by a frequency of the high frequency signal HFM. As a result, a current $I=I_{th}$ and a current $I=I_{th}+I_{HFM}$ is alternatively supplied to the laser diode 1, and $\overline{P}$ accordingly, a read peak output $P_{HFM}$ alternatively appears as shown in FIG. 15. In this case, a mean value $\overline{P}$ of a light power P of is brought close to the base read output $P_R$ by an automatic power control of the APC circuit 4, as shown in FIG. 15.

During a write mode for data "0", the main controller 14 generates a gate signal WGT2 (="1") and a data signal WDT2 (="0"), and the gate circuit 8 generates a first gate signal $\overline{WGT}$ (="0"), and the gate circuit 8 and a fourth gate signal WGT·HFM +WGT·WDT (="0"). By the first gate signal $\overline{WGT}$ and the second gate signal WGT, the switches 72 and 74 are turned ON, and the switches 71 and 73 are turned OFF. Therefore, the voltage $V_R$ is applied to the control current source 2′-2, and the voltage $V_M$ is applied to the control current source 2′-3. By the third gate signal WGT·WDT (="0"), the current switch 10 is turned OFF, and therefore, a monitored output current $I_M$ is not absorbed in the control current source 9. By the fourth gate signal $\overline{WGT}$·HFM+WGT·WDT (="0"), the current switch 3, is turned OFF. As a result, a current $I=I_{th}+I_R$ is supplied to the laser diode 1, and accordingly, the base read output $P_R$ appears as shown in FIG. 15. In this case, a light power $P_1$ is brought close to the base read output $P_R$ by an automatic power control of the APC circuit 4, as shown in FIG. 15.

During a write mode for data "1", the main controller 14 generates a gate signal WGT2 (="1") and a data signal WDT2 (="1"), and the gate circuit 8 generates a first gate signal $\overline{WGT}$ (="0"), a second gate signal WGT (="1"), a third gate signal WGT·WDT (="1"), and a fourth gate signal $\overline{WGT}$·HFM +WGT·WDT (="1"). By the first gate signal $\overline{WGT}$ and the second gate signal WGT, the switches 72 and 74 are turned ON, and the switches 71 and 73 are turned OFF. Therefore, the voltage $V_R$ is applied to the control current source 2′-2, and the voltage $V_W$ is applied to the control current source 2′-3. By the third gate signal WGT·WDT (="1"), the current switch 10 is turned ON, and therefore, a monitored output current $I_M$ is absorbed in the control current source 9. By the fourth gate signal $\overline{WGT}$·HFM+WGT·WDT (="1"), the current switch 3 turned ON. As a result, a current $I=I_{th}+I_R+I_W$ is supplied to the laser diode 1, and accordingly, the write output $P_W$ appears as shown in FIG. 15. In this case, a light power P2 , which is equal to the write output $P_W$ minus $\Delta P$ corresponding to the write current $I_W$, is brought close to the base read output $P_R$ by an automatic power control of the APC circuit 4, as shown in FIG. 15.

During an erase mode, the main controller 14 always generates a gate signal WGT2 (="1") and a data signal WDT2 (="1"), in the same way as during a write mode for data "1". Therefore, a current $I=I_{th}+I_R+I_W$ is supplied to the laser diode 1, and accordingly, the write output $P_W$ also appears. Also, in this case, a light power P2, which is equal to the write output $P_W$ minus $\Delta P$ corresponding to the write current $I_W$, is brought close to the based read output $P_R$ by an automatic power control of the APC circuit 4.

Figure 15:
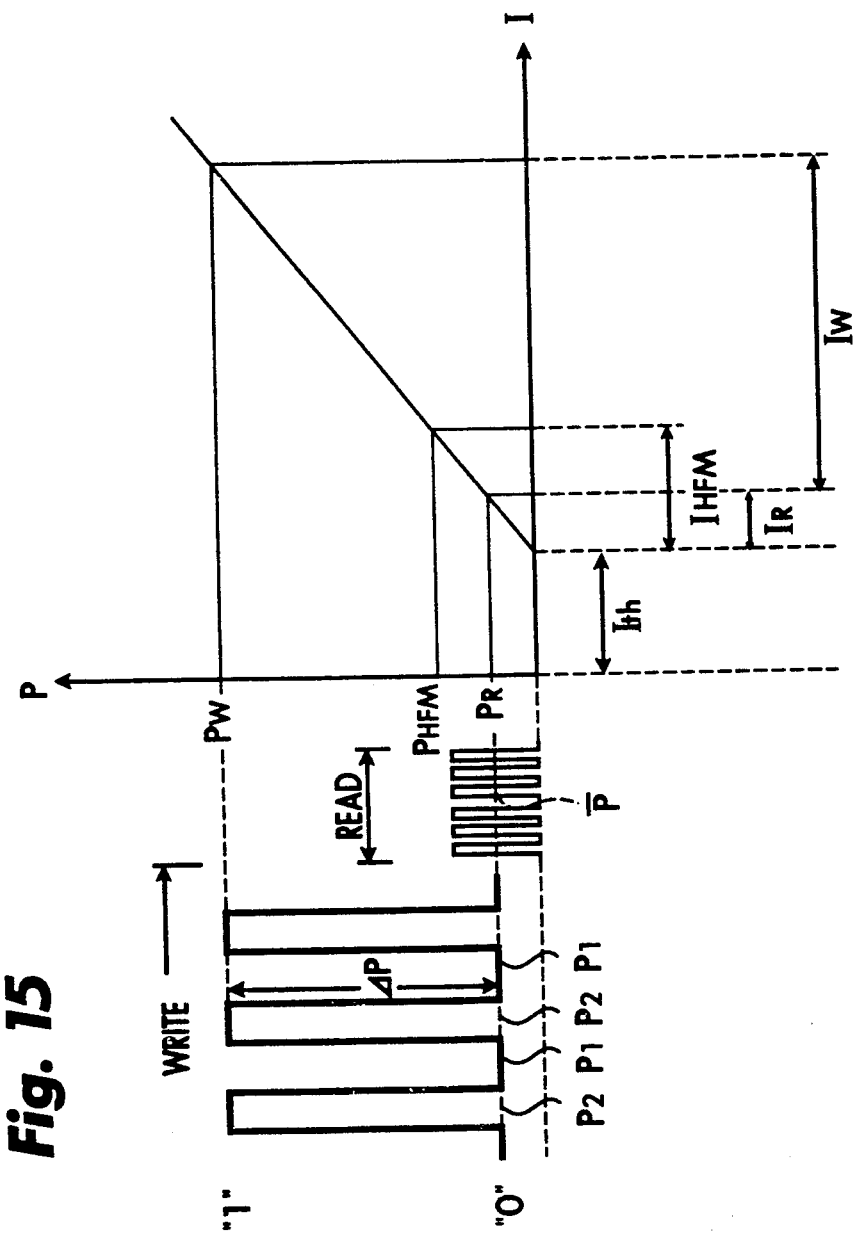
FIG. 15 is a diagram showing a current supplied and a light output characteristic of the apparatus of FIG. 4.

As shown in FIG. 15, the following condition is satisfied:

$$E_R < I_{HFM} < I_R + I_W.$$

Also, as shown in FIG. 15, the mean value of the light power P during a read mode coincides with the light power $P_1$ and $P_2$ during a write mode. Note that both the light power $\bar{P}$ and $P_1$ ($P_2$) are brought close to the base read output $P_R$. Therefore, at a switching between a read mode and a write mode (also erase mode), an automatic power control by the APC circuit 4 is hardly fluctuated.

Figure 16:
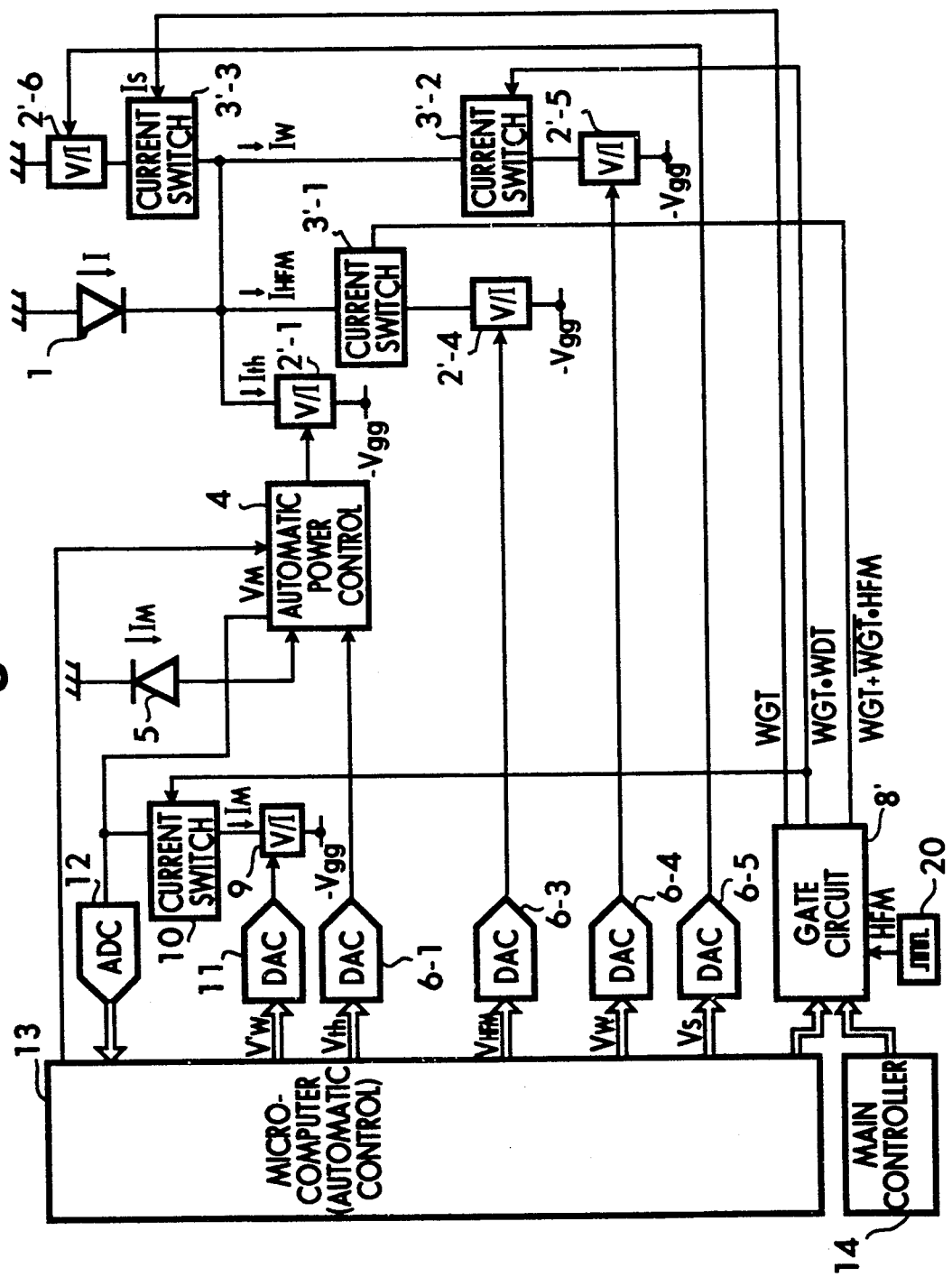
FIG. 16 is a circuit diagram illustrating a second embodiment of the apparatus for supplying a current to laser diode according to the present invention.

In FIG. 16, which is a second embodiment of the present invention, three control current sources 2'-4, 2'-5, and 2'-6 are provided instead of the control current sources 2'-2 and 2,-3 of FIG. 4, and current switches 3'-1, 3'-2, and 3'-3 are connected in series to the control current sources 2'-4, 2,-5, and 2,-6, respectively. Also, the switching circuit 7-1 and 7-2 and the D/A converter 6-2 of FIG. 4 are not provided, and a D/A converter 6-5 is added.

The control current source 2'-4 is used for supplying the read peak current $I_{HFM}$ to the laser diode 1 during a read mode. Therefore, the read peak voltage $V_{HFM}$ is applied by the D/A converter 6-3 to the control current source 2'-4 and the current switch 3'-1 is turned ON in accordance with the high frequency signal HFM during a read mode ($\overline{WGT}$="1"). However, the current switch 3'-1 is turned ON even during a write mode (WGT="1").

The control current source 2'-5 is used for supplying the write current $I_W$ during a write mode for data "1". Therefore, the write voltage $V_W$ for the write current $I_W$ is applied by the D/A converter 6-4 to the control current source 2'-5, and the current switch 3'-2 is turned ON during a write mode for data "1" (WGT =WDT ="1").

The control current source 2'-6 is used for supplying a correction current $I_S$ to the control current sources 2'-1, 2'-4, and 2'-5, i.e., for subtracting the correction current IS from a current I flowing through the laser diode 1 during a write mode. Therefore, a correction voltage VS is applied by the D/A converter 6-5 to the control current source 3'-3, and the current switch 2,-6 is turned ON during a write mode (WGT ="1").

A gate circuit 8, is obtained in FIG. 16 by modifying the gate circuit 8 of FIG. 4.

Figure 17:
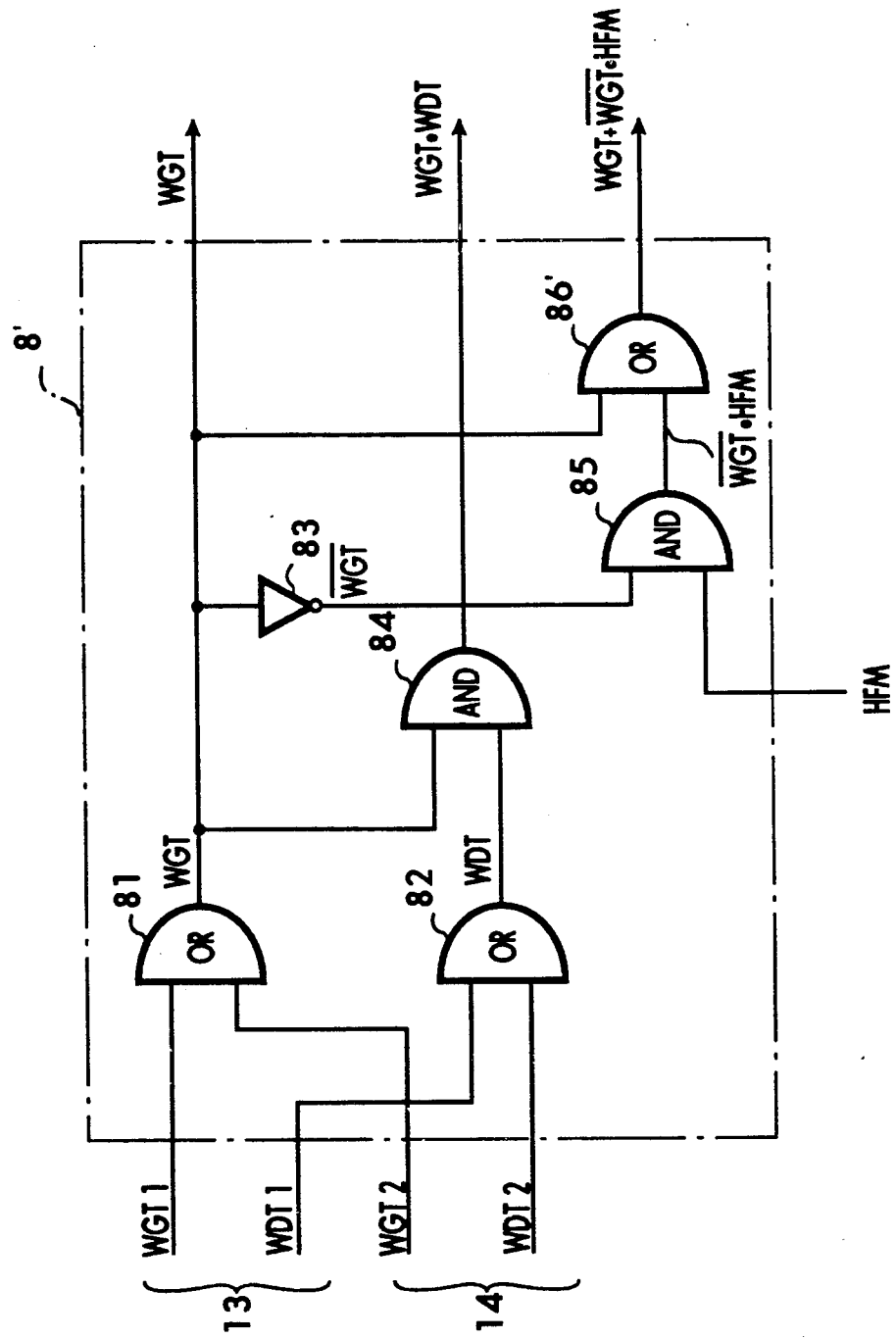
FIG. 17 is a logic circuit diagram of the gate circuit of FIG. 16.

In FIG. 17, which is a detailed circuit diagram of the gate circuit 8' of FIG. 16, an OR circuit 86 is different from the OR circuit 86 of FIG. 5. That is, the OR circuit 86' is connected to the outputs of the OR circuit 81 and the AND circuit 85. Therefore, the OR circuit 86' generates a gate signal WGT+$\overline{WGT}$·HFM. Also, the gate circuit 8, does not generate the gate signal $\overline{WGT}$.

Figure 18:
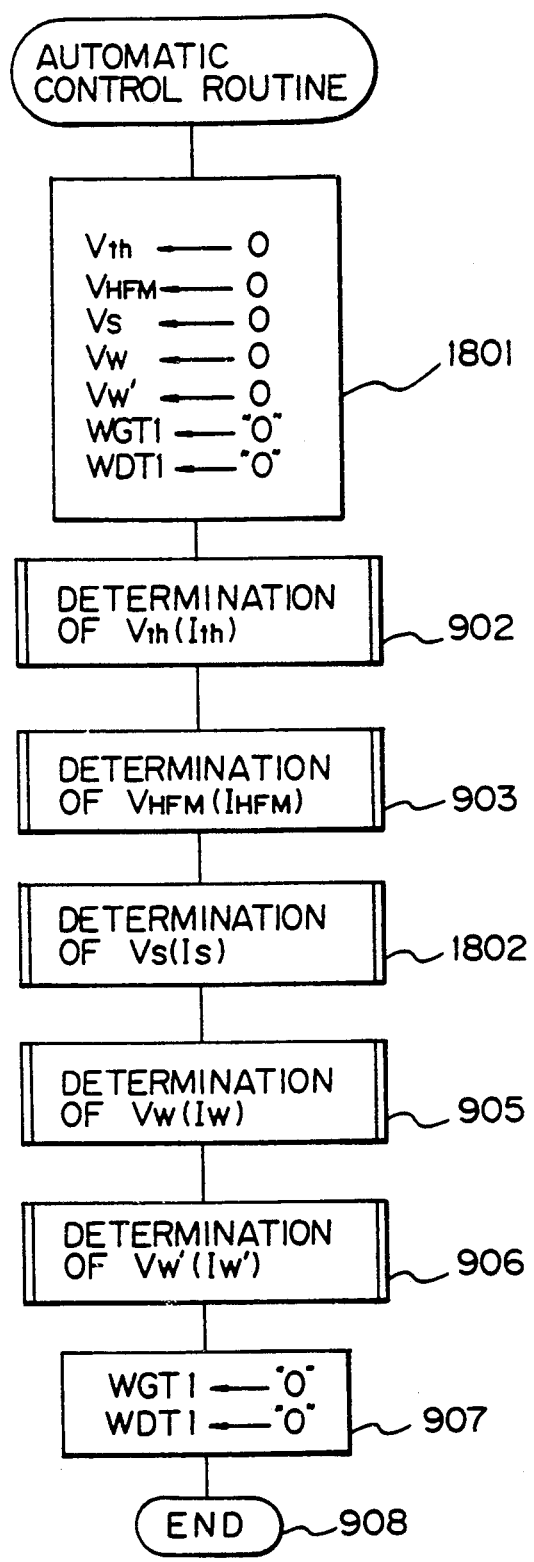
FIGS. 18 and 19 are flowcharts showing the operation of the microcomputer of FIG. 16.

An automatic control by the microcomputer 13 in FIG. 16 is illustrated in FIG. 18. That is, steps 1801 and 1802 are provided instead of steps 901 and 904 of FIG. 9. At step 1801, the value $V_S$ instead of the value $V_R$ is cleared. Also, at step 1802, the value $V_S$ for the correction current $I_S$ for the D/A converter 6-5 is determined.

Figure 19:
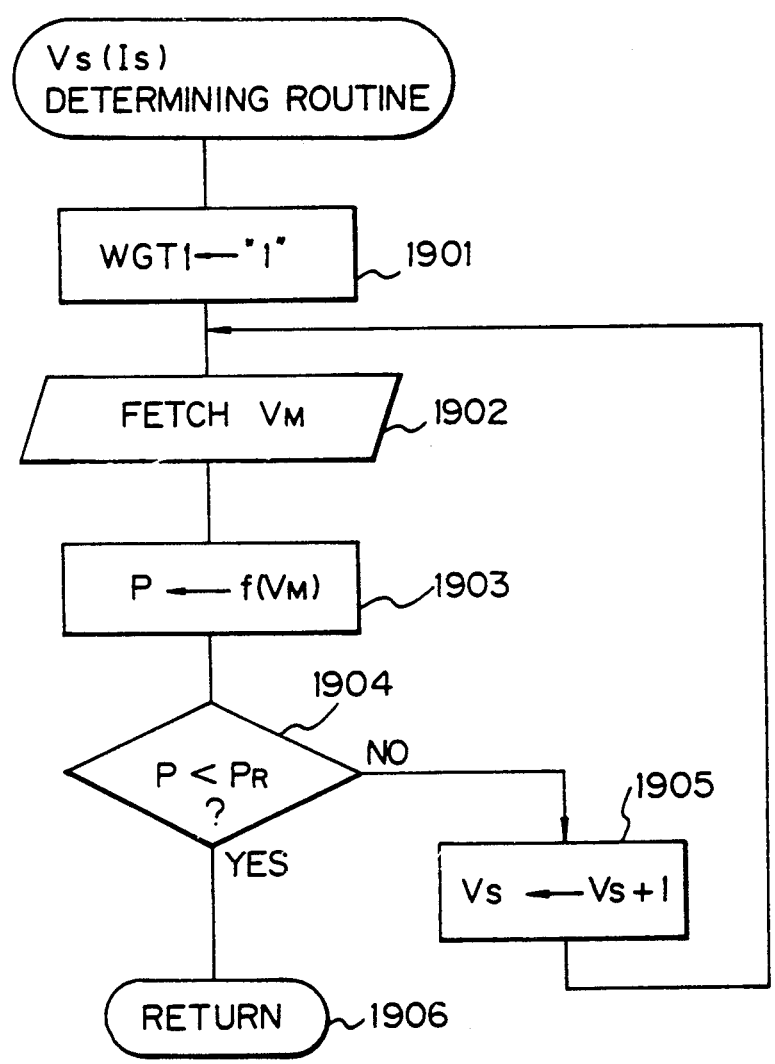

In FIG. 19, which is a detailed flowchart of the $V_S$ ($I_S$) determining step 1802, at step 1901, the gate signal WGT1 is set (WGT1 ="1"), i.e., the gate signal WGT is set (WGT="1"). As a result, the current switch 3'-2 is turned ON, and accordingly, the read peak current $I_{HFM}$ is supplied to the laser diode 1. Also, the current switch 3,-3 is turned ON, and accordingly, a correction current $I_S$ corresponding to the correction voltage $V_S$ which is, in this case, 0 V, flows through the control current source 2'-6. Also, in this case, the gate signal WGT·WDT of the gate circuit 8' represents "0", since WDT="1""0" (WDT1 was set to 0 in step 1801 of FIG. 18, and WDT2 was set to zero by the main controller 14). Thus, the current switch 3'-2 is turned OFF. Therefore, a current I =$I_{th}$ +$I_{HFM}$−$I_S$ is supplied to the laser diode 1. Here $I_S$=0.

At step 1902, a monitored output voltage $V_M$ is fetched from the A/D converter 12, and at step 1903, the monitored output voltage $V_M$ is converted into a power P of the laser diode 1 in accordance with the predetermined function $f(V_M)$.

At step 1904, it is determined whether or not P is smaller than $P_R$, i.e., whether or not the light power P reaches the base read output $P_R$. As a result, if $P \geq P_R$, the control proceeds to step 1905 which increases the value $V_S$ by a definite value such as 1, and the control at steps 1902 through 1904 is then repeated. Otherwise, the control proceeds to step 1906, thus completing the routine of FIG. 19. Thus, the value $V_S$ for the correction current $I_S$ is finally determined by the routine of FIG. 19, and is stored in the RAM.

Also, note that, when carrying out the $V_W(I_W)$ determining step 905 and the $V_W'$ ($I_W'$) determining step 906, a current $I=I_{th}+I_{HFM}-I_S+I_W$ is supplied to the laser diode 1.

The operation of the main controller 14 of FIG. 16 will be explained with reference to FIG. 20, which shows a current I supplied to a light power P characteristic of the current supplying apparatus of FIG. 16.

During a read mode, the main controller 14 generates a gate signal WGT2 (="0") ... and the microcomputer 13 generates a gate signal WGT1 (="0") and accordingly, the gate circuit 8' generates a first gate signal WGT (="0+), second gate signal WGT·WDT (="0"), and a third gate signal WGT+WGT·HFM=HFM. By the first gate signal WGT (="0"), the current switch 3'-3 is turned OFF, and accordingly, the correction current $I_S$ does not flow. By the second gate signal WGT·WDT (="0"), the current switch 3,-2 and 10 are turned OFF, and accordingly, the write current $I_W$ and the current $I_W'$ do not flow.

By the third gate signal HFM, the current switch 3'-1 is switched by a frequency of the high frequency signal HFM. As a result, a current I=$I_{th}$ and a current I=$I_{th}$+$I_{HFM}$ is alternatively supplied to the laser diode 1, and accordingly, a read peak output $P_{HFM}$ alternatively appears as shown in FIG. 20. In this case, a mean value ,e/ovs/P / of a light power P is brought close to the base read output $P_R$ by an automatic power control of the APC circuit 4, as shown in FIG. 20.

During a write mode for data "0", the main controller 14 generates a gate signal WGT2 (="1") and a data signal WDT2 (="0"), and the microcomputer 13 generates a gate signal WDT1 (="0") and the gate circuit 8, generates a first gate signal WGT (="1"), a second gate signal WGT·WDT (="0"), and a third gate signal WGT +$\overline{WGT}$·HFM (="1"). By the first gate signal WGT (="1"), the current switch 3'-3 is turned ON, and accordingly, the correction current $I_S$ flows through the control current source 2'-6. By the second gate signal WGT·WDT current switches 3'-2 and 10 are turned OFF, and accordingly, the write current $I_W$ and the current $I_W$, do not flow. As a result, a current I=$I_{th}$ $+I_{HFM}-I_S$ is supplied to the laser diode 1, and accordingly, the base read output $P_R$ appears as shown in FIG. 20. In this case, a light power $P_1$ is brought close to the base read output $P_R$ by an automatic power control of the APC circuit 4, as shown in FIG. 20.

During a write mode for data "1", the main controller 14 generates a gate signal WGT2 (="13B"), and a data signal WDT2 (="1"), and the gate circuit 8' generates a first gate signal WGT (="13[]"), a second gate signal WGT·WDT (="1"), and a third gate signal WGT+$\overline{WGT}$·HFM (="1"). By the first gate signal WGT (="1"), the current switch 3'-3 is turned ON, and accordingly, the correction current $I_S$ flows through the control current source 2'-6. By the second gate signal WGT·WDT (="31"), the current switches 3'-2 and 10 are turned ON, and accordingly, the write current $I_W$ is supplied to the laser diode 1 and the current $I_W$, in the monitored output current $I_M$ is absorbed by the control current source 9. By the third gate signal WGT+$\overline{WGT}$·HFM (="1"), the current switch 3'-1 is turned ON, and accordingly, the write current $I_W$ is supplied to the laser diode 1. As a result, a current $I=I_{th}+I_{HFM}-I_S+I_W$ is supplied to the laser diode 1, and accordingly, the write output $P_W$ appears as shown in FIG. 20. In this case, a light power $P_2$, which is equal to the light power $P_W$ minus $\Delta P$ corresponding to the write current $I_W$, is brought close to the based read output $P_R$ by an automatic power control of the APC circuit 4, and shown in FIG. 20.

During an erase mode, the main controller 14 always generates a gate signal WGT2 (="1") and a data signal WDT2 (="1"), in the same way as during a write mode for data "1". Therefore, a current $I=I_{th}+I_{HFM}-I_S+I_W$ is supplied to the laser diode 1, and accordingly, the write output $P_W$ also appears. Also, in this case, a light power $P_2$, which is equal to the light power $P_W$ minus $\Delta P$ corresponding to the write current $I_W$, is brought close to the base read output $P_R$ by an automatic power control of the APC circuit 4.

Figure 20:
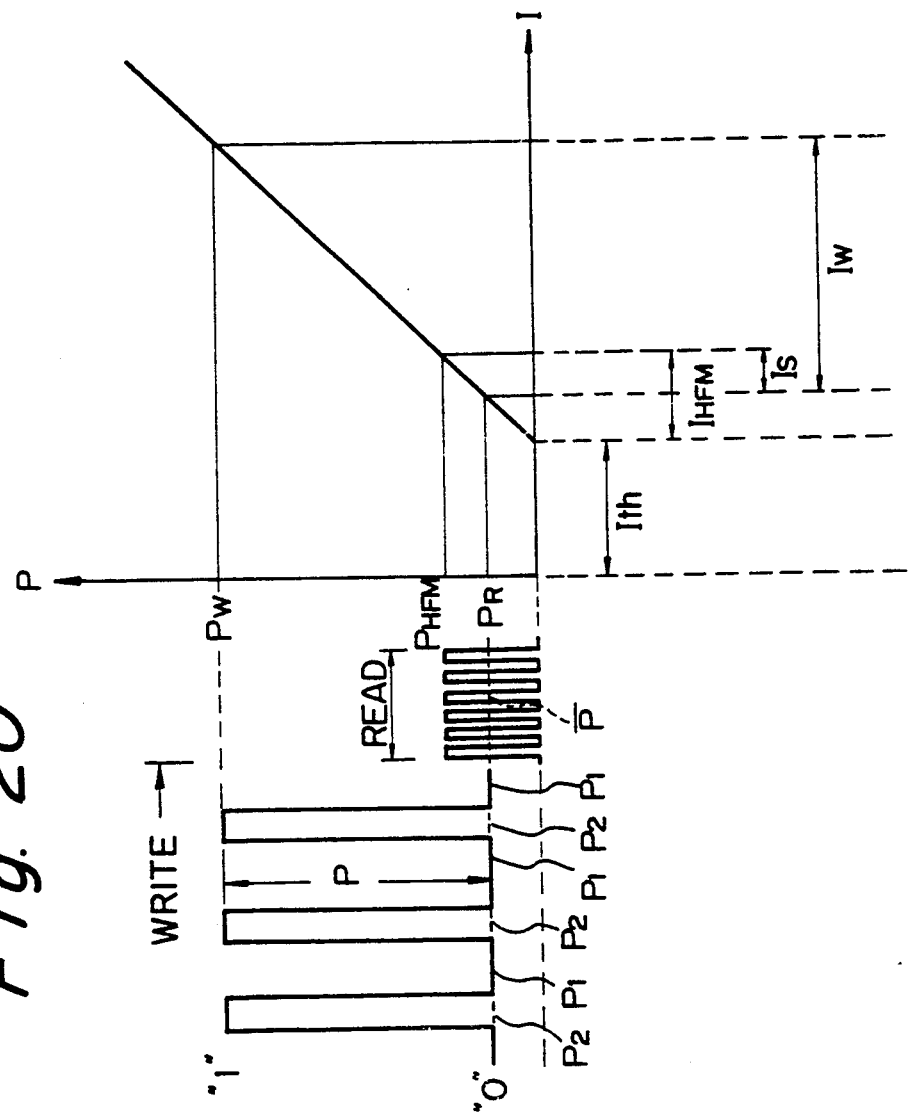
FIG. 20 is a diagram showing a current supplied and a light output characteristic of the apparatus of FIG. 16.

As shown in FIG. 20, the following condition is satisfied.

$$I_{HFM}-I_S < I_{HFM} < I_{HFM}-I_S+I_W.$$

Also, as shown in FIG. 20, the means value $\overline{P}$ of the light power P during a read mode is coincides with the light power $P_1$ and $P_2$ during a write mode. Note that both the light power $\overline{P}$ and $P_1$(or $P_2$) are brought close to the base read output $P_R$. Therefore, at a switching between a read mode and a write mode (also erase mode), an automatic power control by the APC circuit 4 is hardly fluctuated.

In the above-mentioned embodiments, although the value $I_{th}$ is determined by a threshold current of the laser diode 1 which initiates an emitting of light therefrom, the value $I_{th}$ can be smaller than such a threshold circuit.

According to the present invention, fluctuations of an APC at a switching between a read mode and a write mode (or erase mode) can be avoided, to increase an access speed to an optical storage medium.

We claim:

1. An apparatus supplying a current to a laser diode emitting light onto an optical storage medium to thereby read digital read data from the optical storage medium and to write digital write data to the optical storage medium, said apparatus comprising:

light power monitoring means for monitoring a light power of the light emitted from said laser diode forming a monitored light power;

first current supply means for supplying a first current to said laser diode;

second current supply means for supplying a second current to said laser diode during a write mode;

third current supply means for supplying a third current to said laser diode during a read mode, said third current being modulated with a high frequency signals and said first current being supplied to said laser diode resulting in a mean value of the monitored light power equal to a base read power;

fourth current supply means for supplying a fourth current to said laser diode during a write mode;

switching means for turning one of ON and OFF said fourth current in accordance with write data during the write mode; and automatic power control means for controlling said first current in accordance with the monitored light power.

2. An apparatus as set forth in claim 1, wherein said first current being one of equal to and smaller than a threshold current which is a minimum current at which said laser diode emits the light.

3. An apparatus as set forth in claim 1, wherein a sum of said first current and said second current equal as a value, said value being between a threshold current and said third current and being supplied to said laser diode resulting in the monitored light power equal to the base read power.

4. An apparatus as set forth in claim 1, wherein a sum of said first current and said third current being larger than a threshold current and being supplied to said laser diode resulting in the monitored light power equal to a read peak power.

5. An apparatus as set forth in claim 1, wherein a first sum of said first current and said fourth current is larger than a second sum of said first current and said third current and said first sum being supplied to said laser diode resulting in the monitored light power equal to a write power.

6. An apparatus as set forth in claim 1, further comprising:

high frequency signal generating means for generating said high frequency signal;

modulating switching means for modulating said third current with said high frequency signal during the read mode; and means for adjusting said third current resulting in a means value of the monitored light power equal to the base read power when a modulated read peak current and a predetermined current are supplied to said laser diode.

7. An apparatus as set forth in claim 1, further comprising means for continuously operating said third and fourth current supply means resulting in the monitored light power equal to a write power.

8. An apparatus as set forth in claim 1, further comprising means for operating said automatic power control means during the read mode and during the write mode for a lower power data.

9. An apparatus as set forth in claim 1, further comprising:

means for operating said automatic power control means during the read mode and during the write mode; and current absorbing means, connected to said light power monitoring means and said automatic power control means, for absorbing a power from the monitored light power when a fourth current is supplied to said laser diode, said power corresponding to a difference between said write power and said base read power.

10. A current supplying apparatus for supplying a current to a laser diode for emitting light to an optical storage medium, to thereby read digital read data from the optical storage medium and to write digital write data to the optical storage medium, said apparatus comprising:

light power monitoring means for monitoring a light power of the light emitted from said laser diode forming a monitored light power;

first current supply means for supplying a first current to said laser diode;

second current supply means for supplying a second current to said laser diode during a read mode with a write mode; said second current being modulated with a high frequency signal and said first current being supplied to said laser diode resulting in a mean value of the monitored light power equal to a base read power;

current absorbing means for absorbing a correction current from said second current during the write mode;

third current supply means of supplying a third current to said laser diode during the write mode;

switching means for turning one of ON and OFF a write current in accordance with write data during the write mode; and automatic power control means for controlling said first current in accordance with the monitored light power.

11. An apparatus as set forth in claim 10, wherein said first current being one of equal to and smaller than a threshold current which is a minimum current at which said laser diode emits the light.

12. An apparatus as set forth in claim 10, wherein a sum of said first current and said second current being larger than a threshold current and being supplied to said laser diode resulting in monitored light power equal to a read peak power.

13. An apparatus as set forth in claim 10, wherein a sum of said first current and said second current minus said correction current being larger than a threshold current and being supplied to said laser diode resulting in the monitored light power equal to the base read power.

14. An apparatus as set forth in claim 10, wherein a first sum of said first current and said third current is larger than a second sum of said first current and said second current and said first sum being supplied to said laser diode resulting in the monitored light power equal to a write power.

15. An apparatus as set forth in claim 10, further comprising:

high frequency signal generating means for generating said high frequency signal;

high frequency signal generating means for generating said high frequency signal;

modulating switching means for modulating said third current with said high frequency signal during the read mode; and means for adjusting said second current forming a modulated second current resulting in a means value of the monitored light power equal to the base read power when the modulated second current and said first current are supplied to said laser diode.

16. An apparatus as set forth in claim 10, further comprising means for continuously operating said second and third current supply means, and said current absorbing means resulting in the monitored light power is always equal to a write power.

17. An apparatus as set forth in claim 10, further comprising means for operating said automatic power control means during the read mode and during the write mode for a lower power data.

18. An apparatus as set forth in claim 10, further comprising:

means for operating said automatic power control means during the read mode and during the write mode; and power absorbing means, connected to said light monitoring means and said automatic power control means, for absorbing power from the monitored light power when said third current is supplied to said laser diode, said power corresponding to a difference between a write power and said base read power.

19. An apparatus supplying a current to a laser diode emitting light onto an optical storage medium for reading read data during a read mode from and writing write data during a write mode to the optical storage medium, the light having a mean value output and the write mode having a minimum light output, said apparatus comprising:

supply means for supplying to the laser diode a predetermined current, a read current during the read mode and a write current during the write mode;

adjusting means for adjusting the predetermined current resulting in the light approximately the minimum light output; and switching means for switching between the read and write modes.

20. An apparatus according to claim 19, wherein said write current being supplied resulting in the light equaling the minimum light output.

21. An apparatus according to claim 20, wherein said adjusting means adjusts the read current resulting in the mean value output equaling the minimum light output.

22. An apparatus according to claim 20, wherein said adjusting means adjusts the read current resulting in the mean value output approximating the minimum light output.

23. A method for supplying a current to a laser diode emitting light onto an optical storage medium for reading read data during a read mode from and writing write data during a write mode to the optical storage medium, the light having a mean value output and the write mode having a minimum light output, the method comprising the steps of:

(a) supplying to the laser diode a predetermined current, a read current during the read mode and a write current during the write mode;

(b) adjusting the predetermined current resulting in the light approximately the minimum light output; and (c) switching between the read and write modes.

24. A method according to claim 23, wherein said supplying in step (a) supplies said write current resulting in the light equaling the minimum light output.

25. A method according to claim 24, further comprising the step of:
 (d) adjusting the read current resulting in the mean value output equaling the minimum light output.

26. An apparatus according to claim 24, further comprising the strep of:
 (d) adjusting the read current resulting in the mean value output approximating the minimum light output.

* * * * *

UNITED STATES PATENT AND TRADEMARK OFFICE
CERTIFICATE OF CORRECTION

PATENT NO. : 5,197,059

DATED : March 23, 1993

INVENTOR(S) : Minami et al.

It is certified that error appears in the above-indentified patent and that said Letters Patent is hereby corrected as shown below:

Cover Page [56], "References Cited", "U.S. PATENT DOCUMENTS", below "5,059,780 10/91 Kakuta et al. ......... 250/205", add --4,811,329 3/89 Shikama et al. .......... 369/116--.

Cover Page [56], "References Cited", "FOREIGN PATENT DOCUMENTS", below "2-249147 10/1990 Japan", add
-- 61-192043   1/1987   Japan
   61-296539   5/1987   Japan
   0223576     5/1987   Euro. Pat. Office
   0082357     6/1983   Euro. Pat. Office
   62-140482  11/1987   Japan--.

Col. 1, line 43, "(S/W)" should be --(S/N)--.

Col. 2, line 1, delete "to";
line 26, "an apparatus" should be --or approaches--;
line 49, delete "circuit".

Col. 5, line 19, "Vth,Note" should be --Vth. Note--;
line 39 should be deleted;
line 40, "value" should be --a value--.

Col. 6, line 7, "data" should be --gate--.

Col. 8, line 39, "as" should be --are--;
line 50, after "current" insert --source 2'-2 in Fig. 4. Also, in this case, the gate signal--.

UNITED STATES PATENT AND TRADEMARK OFFICE
CERTIFICATE OF CORRECTION

PATENT NO. : 5,197,059

DATED : March 23, 1993            PAGE 2 of 2

INVENTOR(S) : Minami et al.

It is certified that error appears in the above-identified patent and that said Letters Patent is hereby corrected as shown below:

Col. 9,   line 59, "),"  should be --) and the microcomputer 13 generates a gate signal WGT1 (= "0"),--.

Col. 10,  line 15, "),"  should be --) and the microcomputer 13 generates a gate signal WDT1 (= "0"),--.

Col. 11,  line 50, "86" should be --86'--.

Col. 12,  line 5, " "1""0" " should be --"0"--;
          line 35, "(="0")..." should be --(="0"),--;
          line 60, "8," should be --8'--.

Col. 13,  line 46, delete "is".

Col. 14,  line 48, "modulating" should be --second--;
          line 50, "means" should be --mean--.

Col. 15,  line 6, "said" should be --a--;
          line 68, "means" should be --mean--.

Signed and Sealed this

Third Day of May, 1994

Attest:

BRUCE LEHMAN

Attesting Officer        Commissioner of Patents and Trademarks

UNITED STATES PATENT AND TRADEMARK OFFICE
CERTIFICATE OF CORRECTION

PATENT NO. : 5,197,059
DATED : March 23, 1993
INVENTOR(S) : Akira Minami, et al

It is certified that error appears in the above-indentified patent and that said Letters Patent is hereby corrected as shown below:

Col. 14, line 51, "means" should be --mean--.

Signed and Sealed this

Fifth Day of March, 1996

Attest:

BRUCE LEHMAN

Attesting Officer

Commissioner of Patents and Trademarks